(12) United States Patent
Nakamura et al.

(10) Patent No.: US 6,185,474 B1
(45) Date of Patent: Feb. 6, 2001

(54) EXPOSURE UNIT, EXPOSURE SYSTEM AND DEVICE MANUFACTURING METHOD

(75) Inventors: Takashi Nakamura, Utsunomiya; Yasuyoshi Yamada, Tokyo; Satoshi Kyotoku, Utsunomiya, all of (JP)

(73) Assignee: Canon Kabushiki Kaisha, Tokyo (JP)

(*) Notice: Under 35 U.S.C. 154(b), the term of this patent shall be extended for 0 days.

(21) Appl. No.: 09/034,019

(22) Filed: Mar. 2, 1998

(30) Foreign Application Priority Data

Apr. 3, 1997 (JP) .................................................. 9-063984
Jul. 11, 1997 (JP) .................................................. 9-320625

(51) Int. Cl.[7] .............................. G05D 1/00; G06F 19/00
(52) U.S. Cl. .................................. 700/121; 700/3; 700/4; 395/500.22
(58) Field of Search .................................. 700/121.96, 3, 700/93; 395/500.22; 355/43; 430/5; 340/825.06

(56) References Cited

U.S. PATENT DOCUMENTS

| 4,974,166 |   | 11/1990 | Maney et al. ........................ 700/213 |
| 5,105,362 | * | 4/1992  | Kotani ............................... 364/468.15 |
| 5,126,932 |   | 6/1992  | Wolfson et al. ......................... 700/2 |
| 5,432,702 | * | 7/1995  | Barnett ............................ 364/468.23 |
| 5,448,488 | * | 9/1995  | Oshima ............................. 364/468.28 |
| 5,497,331 | * | 3/1996  | Iriki et al. ........................ 364/468.28 |
| 5,764,980 | * | 6/1998  | Davis et al. ......................... 707/104 |
| 5,867,389 | * | 2/1999  | Hamada et al. ....................... 700/83 |

FOREIGN PATENT DOCUMENTS

| 0 507 589 A2 | 4/1992  | (EP) . |
| 4-286311     | 10/1992 | (JP) . |
| 4-305913     | 10/1992 | (JP) . |
| 5-62873      | 3/1993  | (JP) . |

\* cited by examiner

*Primary Examiner*—William Grant
*Assistant Examiner*—Kidest Bahta
(74) *Attorney, Agent, or Firm*—Fitzpatrick, Cella, Harper & Scinto

(57) ABSTRACT

A network type exposure unit connected via a communication network to other exposure units or to an information processor determines whether or not exposure work information of the instructed kind of exposure work is in the storage thereof. When the instructed exposure work information is determined to be non-existent, the unit inquires of the other exposure units or a host equipment whether or not there is therein the exposure work information, and decides executability of the exposure work requested to be started from the result thereof. The exposure work information can be transferred between arbitrary units, thereby alleviating complexity of maintenance and management of the exposure work information.

36 Claims, 16 Drawing Sheets

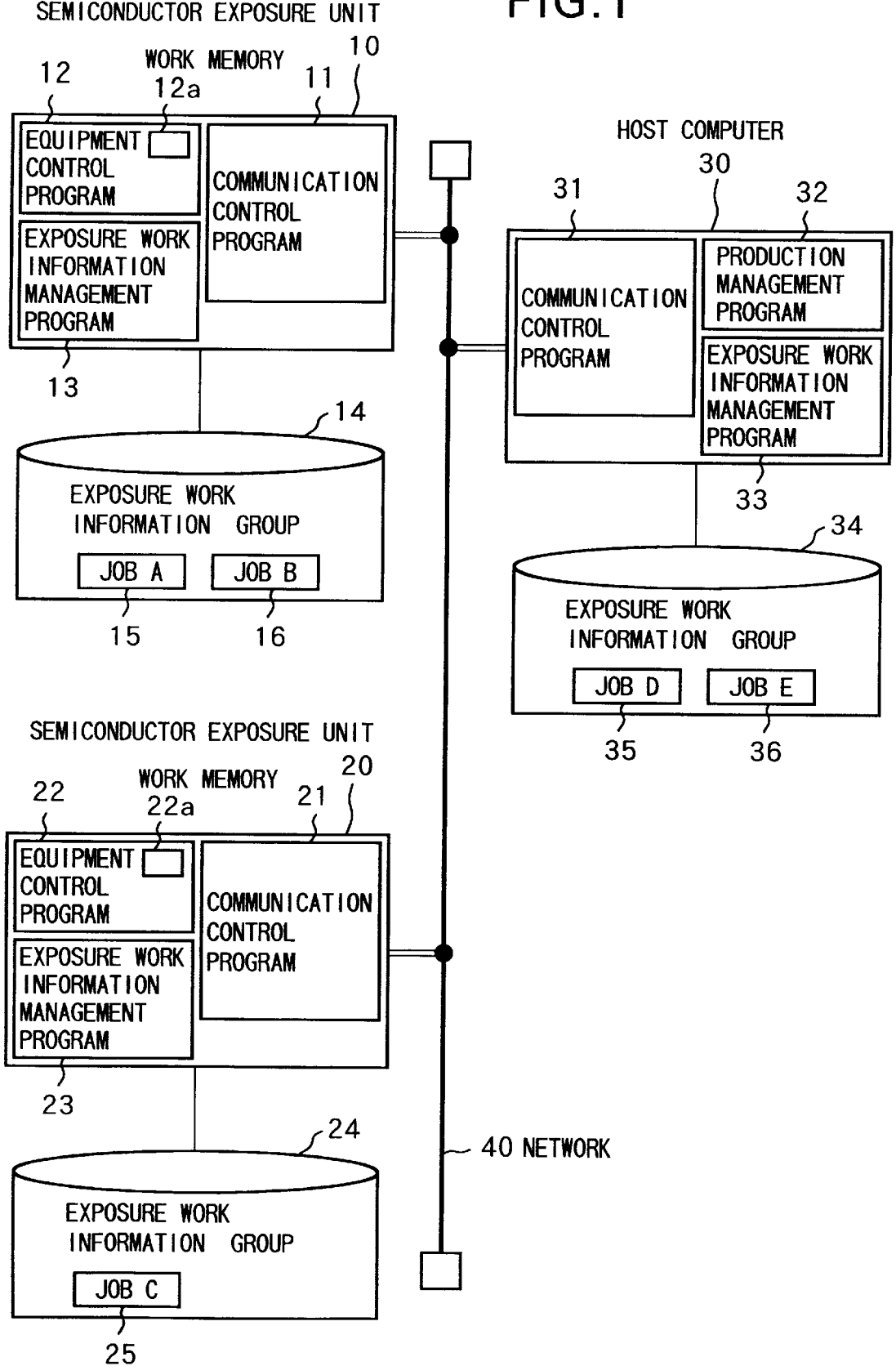

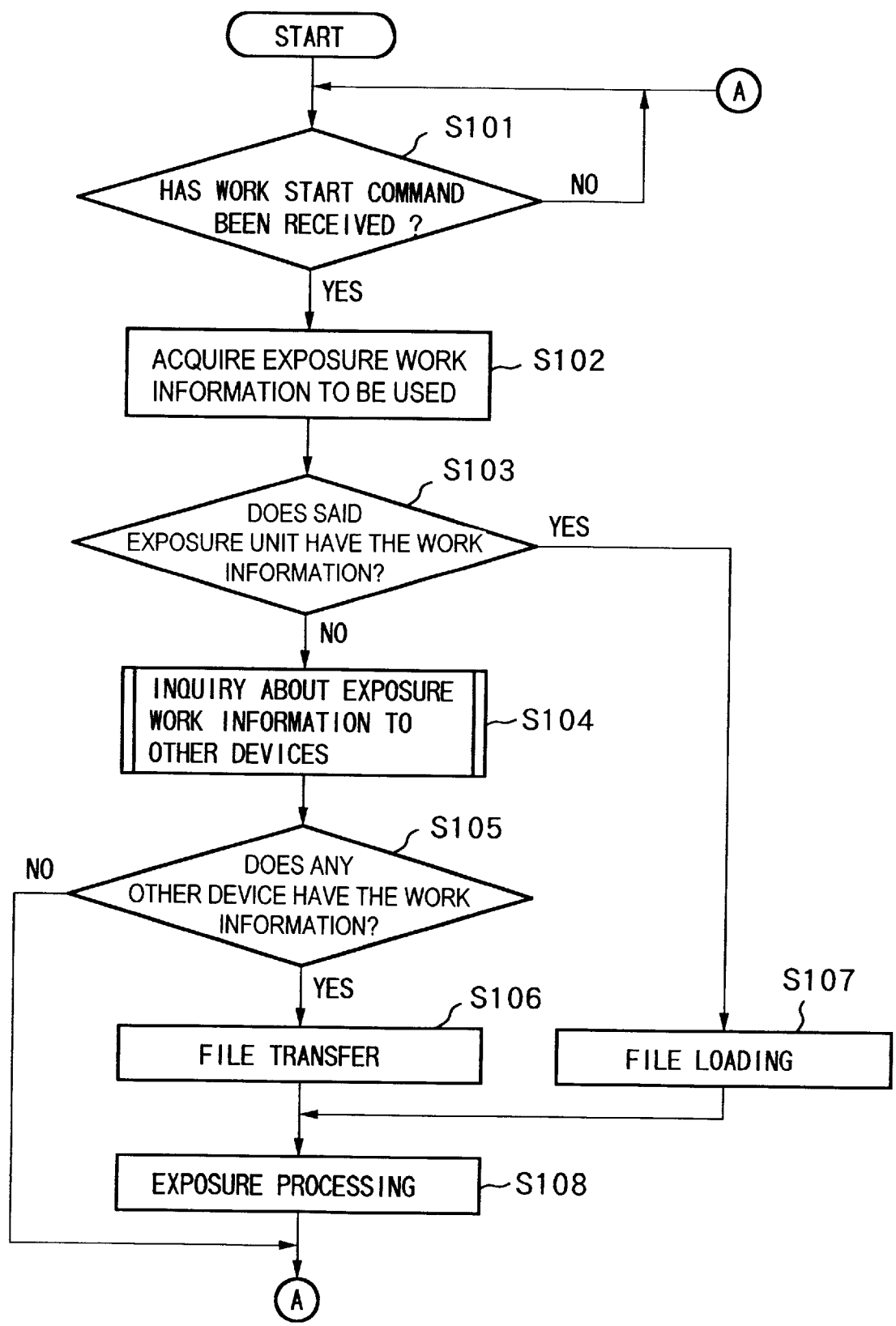

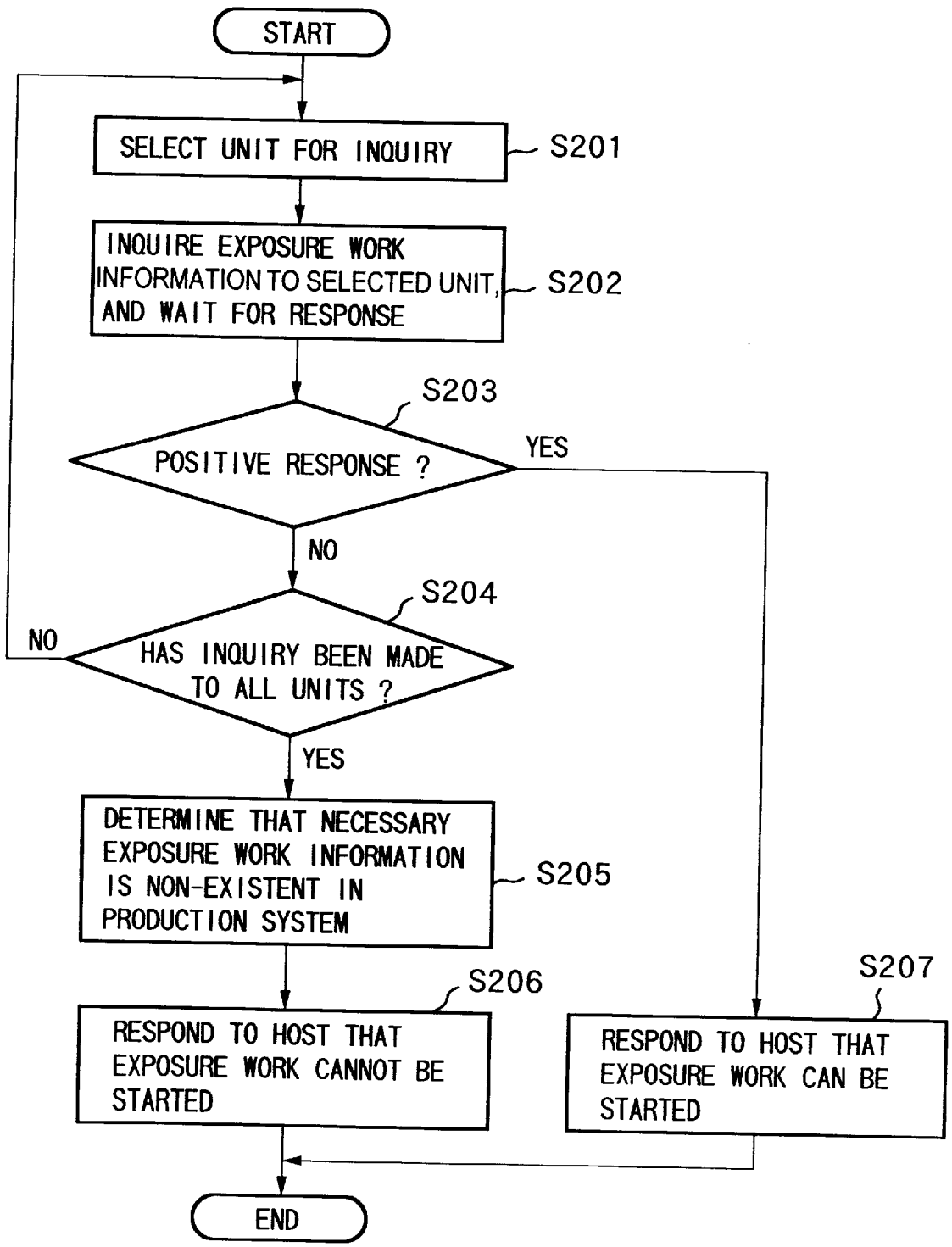

FIG. 4A 50

MESSAGE EXPRESSING START OF EXPOSURE WORK

| EXPOSURE WORK START COMMAND | EXPOSURE WORK INFORMATION NAME "JOB C" |

FIG. 4B 51

MESSAGE FOR INQUIRY ABOUT EXPOSURE WORK INFORMATION

| INQUIRY COMMAND | EXPOSURE WORK INFORMATION NAME "JOB C" |

FIG. 4C 52

NEGATIVE MESSAGE MEANING NON-EXISTENCE OF EXPOSURE WORK INFORMATION

| NEGATIVE RESPONSE | EXPOSURE WORK INFORMATION NAME "JOB C" |

FIG. 4D 53

POSITIVE MESSAGE MEANING EXISTENCE OF EXPOSURE WORK INFORMATION

| POSITIVE RESPONSE | EXPOSURE WORK INFORMATION NAME "JOB C" |

FIG. 4E 54

MESSAGE PERMITTING START OF EXPOSURE WORK

| START OF EXPOSURE WORK PERMITTED |

FIG. 4F 55

MESSAGE NOT PERMITTING START OF EXPOSURE WORK

| START OF EXPOSURE WORK NOT PERMITTED |

FIG. 4G 56

POSITIVE MESSAGE MEANING EXISTENCE OF EXPOSURE WORK INFORMATION (WITH EXPOSURE WORK INFORMATION)

| POSITIVE RESPONSE WITH EXPOSURE WORK INFORMATION | EXPOSURE WORK INFORMATION NAME "JOB C" | CONTENTS OF EXPOSURE WORK INFORMATION |

| REGISTRATION STEPPER | REGISTERED DATA FILE NAME | DELETING TIMING |
|---|---|---|
| STP1 | /asic/asic001a. job | MAY 19, 1997, 21:00:00 |
| STP2 | /asic/asic001a − patch. rtc | OCT 30, 1997, 21:00:00 |
| STP3 | /asic/*. job | NOV 31, 1997, 21:00:00 |

701   702   703

MANUFACTURING FLOW OF SEMICONDUCTOR DEVICE

WAFER PROCESS

EXPOSURE UNIT, EXPOSURE SYSTEM AND DEVICE MANUFACTURING METHOD

BACKGROUND OF THE INVENTION

The present invention relates to an exposure unit for the manufacture of a semiconductor device, a semiconductor production system formed by combining a plurality of such exposure units in a communication network, and a method for manufacturing a semiconductor based on such a system.

In a standalone type semiconductor exposure unit (stepper) not network-connected by an LAN or the like, in general, it is necessary to provide a data file group such as a required job file or reticle file individually for each stepper. This has caused for an operator a troublesome operation of loading necessary data in a local storage included in a desired stepper arranged in a clean room with the use of a removable storage medium such as a floppy disk (FD) or a photomagnetic disk (MO), for example, storing a necessary data file.

There are conventionally many semiconductor manufacturing plants managed in compliance with a protocol of the Semiconductor Communication Standard (SECS), commonly known as an online system, on the other hand, connected to a host computer by a low-speed serial line such as RS232C. In such an online system, it is possible to perform control of the stepper using a command, status control of the stepper, and partial modification of date files.

In an online system, as described above, a data file such as a job file or a reticle file used for an exposure operation can be switched over by an online command. For a data file itself having a relatively large data capacity, however, the online system employs a low-speed line in many cases, and as a result, a configuration permitting transmission on the line is not used. It is, therefore, necessary to previously provide these files on steppers conducting exposure.

In a general semiconductor production system, therefore, the only function of the host computer is to determine a kind of exposure operation in each of the steppers connected in a communication network, and to request a start of the exposure operation. As a result, a data file containing exposure work information (known also as a job) showing contents of the work to be executed must be present on the stepper to be used for exposing the semiconductor. Consequently, when using a plurality of steppers, all the steppers are required to have all pieces of exposure work information which may be necessary in the individual storage areas.

The configuration as described above is, however, defective in that it is necessary to previously investigate and collect all pieces of exposure work information which may be necessary, causing complicated maintenance and management of exposure work information.

Further, it is probable that the stepper has in the storage area thereof pieces of exposure work information that will never be used. It is, therefore, necessary to increase the capacity of the storage area, thus resulting in economic demerits.

Particularly, hundreds or even thousands of files are required for productions of some sorts of semiconductor devices, and providing all these files on the stepper is heavy on the storage capacity of the stepper and finally leads to a shortage of the capacity. In addition, in the exposure process using a number of data files such as ASIC, there is a demand for smooth and efficient management of these files. Preparing and compiling operations of these data files are conducted outside of a clean room, and in many cases, correction of defects in parameters and modification of trial parameters are performed very often. This leads to a demand for automatic updating of files via a network into the latest ones as requested.

SUMMARY OF THE INVENTION

The present invention was developed with the foregoing problems in view and has an object to permit easy determination whether or not exposure work information necessary for exposure processing is present in the system with a view to alleviating troubles in maintenance and management of the exposure work information.

Another object of the invention is to permit transmission of exposure work information necessary for exposure processing between units in a system, reduce the memory capacity required for an exposure unit, and facilitate maintenance and management of the exposure work information.

To achieve the foregoing objects of the invention, according to an embodiment of the invention, there is provided a network type exposure unit which has storage means storing exposure work information and means for controlling the exposure work by means of the exposure work information for a kind of exposure work specified in response to a request to start the exposure work, and which is connected via a communication network to the other exposure units or an information processor. This exposure unit is provided with work information managing means which determines whether or not the exposure work information for the specified kind of exposure work is in the storage means, inquires of the other exposure unit or the information processor about whether or not there is the exposure work information therein when non-existence is determined, and decides whether or not the exposure work of which the start is requested is executable on the basis of the result thereof.

According to another embodiment of the invention, the aforesaid work information managing means acquires the exposure work information for the specified kind of exposure work from the exposure unit or the information processor having given a positive response to an inquiry.

According to another embodiment of the invention, upon receipt of an inquiry similar to that described above from the other exposure unit, the work information managing means determines whether or not the exposure work information of that inquiry is in the storage means, and transmits the result thereof to the other exposure unit having made the inquiry. When transmitting a positive result to the other exposure unit having made the inquiry, the work information managing means may incorporate the work information regarding the inquiry in the transmitted result.

According to another embodiment of the invention, the work information managing means makes an inquiry as to whether or not there is a particular piece of exposure work information in a sequence of exposure units or information processors from the lowest to higher costs required for acquiring that work information, and acquires that work information from the first positive respondent. Or, according to another embodiment of the invention, the inquiry as to whether or not there is the exposure work information is made to all the other exposure units or information processors as far as possible, and the exposure work information is acquired from the respondent with the lowest cost required for obtaining the exposure work information from among positive respondents.

According to another embodiment of the invention, there is provided a semiconductor exposure system having a plurality of network type exposure units as described above and an information processor as described above.

In this semiconductor exposure system, the information processor determines the kind of exposure work in each exposure unit, and requests each exposure unit to start the exposure work. When the exposure work information corresponding to the kind of exposure work instructed along with the start request of the exposure work from the information processor is not present, the exposure unit receiving the work start request inquires of the other exposure units or the information processor about whether or not the same has that exposure work information, determines whether or not the exposure work of the instructed kind is executable on the basis of responses to such an inquiry, and transmits the result thereof to the information processor.

Further, according to another embodiment of the invention, there is provided a semiconductor manufacturing method in which, when the specified exposure unit has, upon carrying out the exposure work of the instructed kind by the use of the corresponding exposure work information, the work information, the specified exposure unit performs the exposure work on the basis of that work information, and when the unit has not the aforesaid work information, acquires that work information from the other exposure units or the information processor connected to that specified exposure unit via a communication network, and carries out the exposure work on the basis of that work information.

In this embodiment, the exposure work information of the instructed kind of exposure work is acquired, by inquiring of the other exposure units or the information processor about whether or not the exposure work information is present therein, from the exposure unit or the information processor having given a positive response to such an inquiry. The inquiring as to the presence or absence of the exposure work information is made in a sequence of an exposure unit or the information processor from the lowest cost for obtaining that work information, and that work information is acquired from the respondent having given the first positive response. Or, an inquiry is made to all possible other exposure units or the information processor, and that exposure work information is obtained from the respondent requiring the minimum cost for obtaining the exposure work information from among positive respondents.

According to another embodiment of the invention, there is provided a semiconductor exposure system in which a server and semiconductor exposure units are connected by a network connecting means to form a network. This system has a configuration in which the server transfers a data file necessary for processing in the semiconductor exposure unit to the semiconductor exposure unit in response to a request therefrom. This permits efficient use of many and the latest data files in the semiconductor exposure unit while alleviating the load on the storage capacity in the semiconductor exposure unit.

According to another embodiment of the invention, there is provided a semiconductor exposure unit used in a semiconductor exposure system in which a server and semiconductor exposure units are connected by network connecting means into a network. The foregoing unit has means for requesting from the server a data file necessary for processing in the semiconductor exposure unit and receiving the data transferred from the server in response thereto.

According to another embodiment of the invention, there is provided a device manufacturing method for manufacturing a device through exposure by using a semiconductor exposure system in which a sever and semiconductor exposure units are connected by network connecting means into a network. According to this method, a data file necessary for processing by the semiconductor exposure unit is transferred from the server to the semiconductor exposure unit thereto in response to a request from the semiconductor exposure unit.

In this embodiment, the semiconductor exposure unit requests the server to transfer the data file on demand (at the request thereof) when the data file in an exposure operation becomes necessary. The server acts so as to transfer the data at any time in response to the request from the semiconductor exposure unit.

In this method, a desired data file is available on demand from the server. It is not, therefore, necessary to provide a storage capacity to store all data files required by the semiconductor exposure unit on the side thereof. As a result, it is possible to minimize the capacity of the local storage of the semiconductor exposure unit, and automate updating to the latest file, thus permitting improvement of the convenience of data file management necessary for the exposure work.

Other features and advantages of the present invention will be apparent from the following description taken in conjunction with the accompanying drawings, in which like reference characters designate the same or similar parts throughout the figures thereof.

BRIEF DESCRIPTION OF THE DRAWING

The accompanying drawings, which are incorporated in and constitute a part of the specification, illustrate embodiments of the invention, and together with the description, serve to explain the principles of the invention.

FIG. 1 is a block diagram illustrating a partial configuration of the semiconductor exposure system of a first embodiment of the invention;

FIG. 2 is a flowchart illustrating operations of the exposure unit of the first embodiment;

FIG. 3 is a flowchart illustrating the inquiry processing of the exposure work information of the first embodiment;

FIGS. 4A to 4G illustrate contents of messages transferred between units of the first embodiment;

DETAILED DESCRIPTION OF THE PREFERRED EMBODIMENTS

Preferred embodiments of the present invention will now be described in detail in accordance with the accompanying drawings.

First Embodiment

A first embodiment of the invention will now be described with reference to the drawings.

Figure 10:
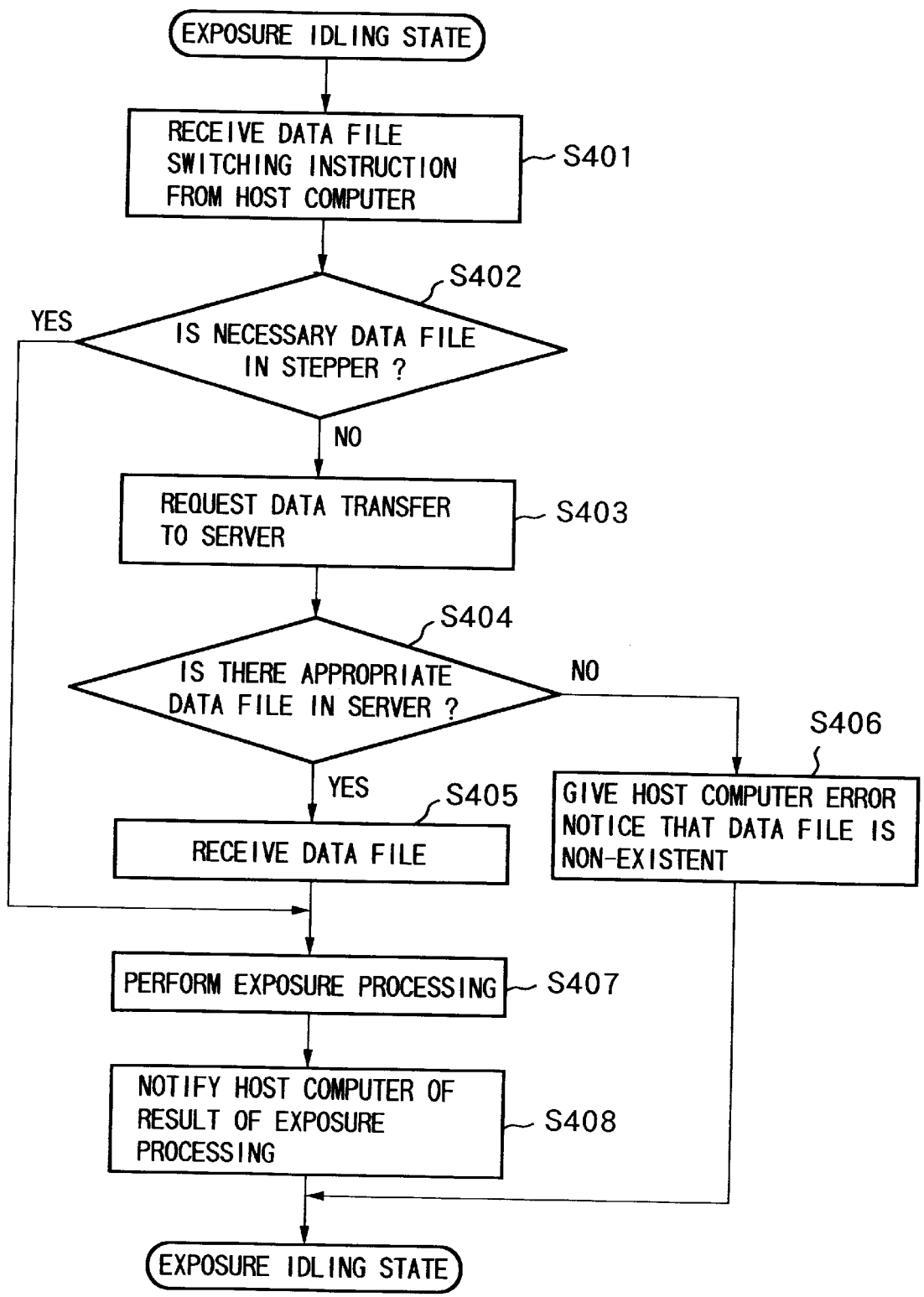
FIG. 10 is a flowchart illustrating operations of the third embodiment.

FIG. 1 is a block diagram illustrating a partial configuration of the semiconductor production system of the first embodiment of the invention. In FIG. 1, 10 and 20 are semiconductor exposure units, and 30 is a host computer managing the production system.

The semiconductor exposure unit 10 is provided with a communication control program 11, an equipment control program 12, an exposure work information management program 13 and a storage 14, and communicates with the other semiconductor exposure units 20 and the host computer 30 via a network 40 by the communication control program 11. In this configuration, the equipment control program 12 performs control of the equipment (not shown) necessary for exposure work. Exposure work information (known also as a job) necessary for exposure work is stored in the storage 14. The equipment control program 12 carries out exposure processing on the basis of the exposure work information loaded onto a work memory 12a.

The exposure work information management program 13 checks for the presence or absence of the job necessary for the exposure work and manages input/output into and from the storage 14. The exposure work information management program 13 has a function of inquiring of the other semiconductor exposure units and the host computer about the exposure work information. Further, the exposure work information management program 13 has a function of managing the job and a function of responding to an inquiry from the other units about the exposure work information.

The above description is also the case with the configuration of the semiconductor exposure unit 20.

The host computer 30 is provided with a communication control program 31, a production control program 32, an exposure information management program 33 and a storage 34. Then, programs 31 and 33 have the same functions as those of the programs 11 and 13 of the semiconductor exposure unit 10. TCP/IP, Net Ware or Apple Talk may be used as the protocol for the network 40.

The production control program 32 instructs the start of exposure work to the semiconductor exposure units 10 and 20 connected by the network 40, and specifies the kind of exposure work information to be used.

Now, processing by the exposure work information management program in the first embodiment will be described with reference to the flowcharts of FIGS. 2 and 3. In this embodiment, it is assumed that semiconductor exposure unit 10 has pieces of exposure work information 15 and 16 (called job A and job B, respectively), the semiconductor exposure unit 20 has exposure work information 25 (called job C), and the host computer 30 has pieces of exposure work information 35 and 36 (called job D and job E, respectively).

Assume now that the production control program 32 of the host computer 30 instructs the semiconductor exposure unit 10 to carry out exposure work by the use of the exposure work information called as the job C. The message sent by the computer 30 to the semiconductor exposure unit 10 takes the form of a message 50 shown in FIG. 4A.

Upon receipt of this message, the exposure work information management program 13 of the semiconductor exposure unit 10 checks for the presence or absence of the exposure work information called as the job C in the storage 14 (Steps S101 and S102). If there is a corresponding piece of exposure work information, the exposure work information is loaded onto the work memory 12a, and the exposure work is started by the use of this information (Steps S103, S107 and S108). In this embodiment, however, the exposure work information called the job C does not exist in the storage 40. Accordingly, the exposure work information management program 13 inquires about the exposure work information in compliance with the flowchart shown in FIG. 3 (Steps S103 and S104). In this embodiment, an inquiry of the host computer 30 is made first, and then to the semiconductor exposure unit 20.

Upon a start of the inquiry, the exposure work information management program 13 selects the host computer 30 as the first counterpart of inquiry (Step S201): the program 13 transmits a message 51 (FIG. 4B) to the host computer 30 to inquire about the exposure work information, and waits for a response (Step S202).

Figure 5:
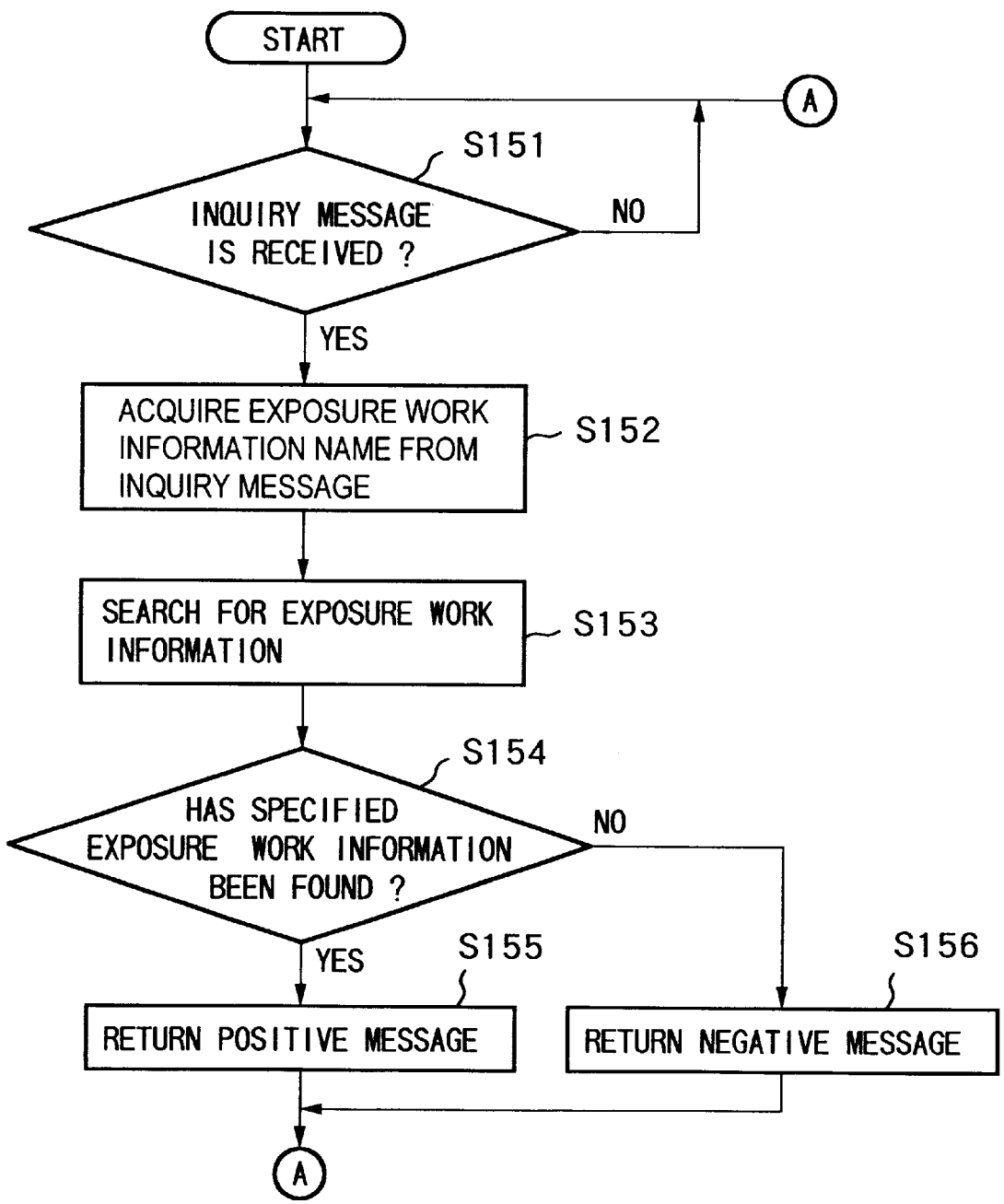
FIG. 5 is a flowchart illustrating the procedure of processing by an exposure work information management program upon receipt of an inquiry message.

In response to this inquiry, the exposure work information management program 33 of the host computer 30 checks for the presence or absence of the job C in the storage 34. FIG. 5 is a flowchart illustrating the processing procedure by the exposure work information management program upon receipt of the inquiry message 51. When it is determined that the inquiry message 51 is received, the exposure work information name is acquired from the inquiry message (Steps S151 and S152). Groups of exposure work information held by the unit are searched for with the thus acquired exposure work information name to determine whether or not the specified exposure work information is existent (Step S153). When there exists the specified exposure work information, a positive message 53 (FIG. 4D) is returned to the unit which sent the inquiry message (Steps S154 and S155). When the specified exposure information is non-existent, a negative message 52 (FIG. 4C) is returned to the unit which sent the inquiry message (Steps S154 and S156).

In this embodiment, the job C is not present in the storage 34. Accordingly, the host computer 30 sends a negative message 52 (FIG. 4C) to the semiconductor exposure unit 10.

Upon receipt of a negative response message 52, the semiconductor exposure unit 10 determines that the message is not a positive response (Step S203). Then, it is determined whether or not the inquiry has been made to all the units (Step S204). Because, at this point, it is determined that the inquiry has not been made to all the units, the semiconductor exposure unit 20 is selected as the unit to which the next inquiry is to be made (Step S201), and the inquiry is made about the exposure work information by means of the message 51 to wait for a response thereto (Step S202).

Upon receipt of this message 51 (inquiry command), the exposure work information management program 23 of the semiconductor exposure unit 20 checks up as to whether or not the job C is present in the storage 24. In this embodiment, the job C exists in the storage 24. Accordingly, the semiconductor exposure unit 20 sends a positive response message 53 (FIG. 4D) to the semiconductor exposure unit 10 through processing shown in FIG. 5.

Upon receipt of the positive response message 53, the semiconductor exposure unit 10 determines that it is a positive response (Step S203), sends a message 54 (FIG. 4E) indicating that the exposure work can be started to the host (Step S207), and completes the inquiry processing about the exposure work information.

When the job C is not found, it is determined that the necessary exposure work information is not existent in the production system (Step S205), and transmits a message 55 (FIG. 4F) indicating impossibility to start the exposure work to the host computer 30 (Step S206), thus completing the inquiry processing of the exposure work information.

Any sequence may be taken for the inquiry about the exposure work information, and it suffices to make an inquiry in accordance with a previously determined sequence. It is the most economical way to make an inquiry in an order from a unit requiring the lowest cost for obtaining the exposure work information, and receive the exposure work information from the unit having given the first positive response indicating the presence of the exposure work information.

Upon completion of an inquiry of the exposure work information as described above, processing is branched, depending upon whether or not the corresponding exposure work information has been found as a result of that inquiry. When the appropriate exposure work information is not found, an exposure work start command is disregarded with no further action and the process returns to Step S101 for processing the next command (Step S105).

When the exposure work information is found as a result of processing in Step S104, on the other hand, the exposure work information is transferred and stored in the work memory 12a (Step S106), and exposure processing is carried out by the use thereof (Step S108).

In the foregoing embodiment, the exposure work information is transferred in Step S106, but the transfer is not limited to this. For example, a message including the exposure work information itself, together with a positive response showing the presence of the exposure work information such as the message 56 (FIG. 4G) may be sent in place of the positive response message 53.

The inquiry may be made to all the units. In this case, the exposure work information may be requested to the unit requiring the minimum cost for obtaining the exposure work information from among the units having the requested exposure work information.

Figure 6:
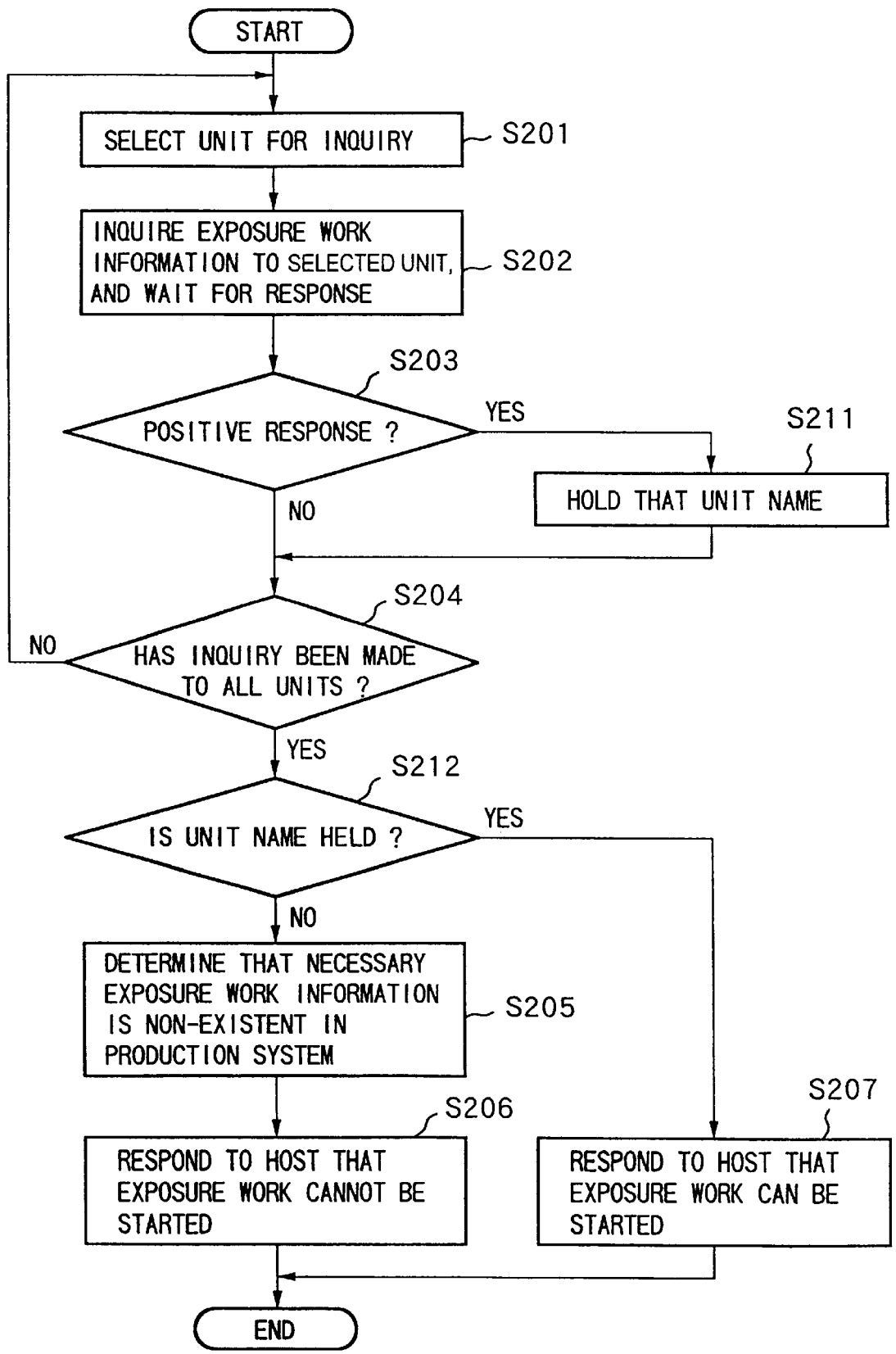
FIG. 6 is a flowchart illustrating the inquiry processing of the exposure work information in a variant of the first embodiment.

In this case, the process may be based on the foregoing Step S104 (FIG. 3) modified into a variant as shown in FIG. 6. According to FIG. 6, when a positive response (message 53) is received in Step S203, the process proceeds to Step S211 to retain the unit name and proceeds to Step S204. As a result, it is possible to confirm the presence or absence of the exposure work information in question for all the units and register units having that exposure work information. Upon completion of processing in Steps S201 to S204 and S211 for all the units, it is determined whether or not a unit having that exposure work information is registered. When at least one unit is registered, go to Step S207, and if there is no registered unit, the process proceeds to Step S205. In file transfer in Step S106 shown in FIG. 2, a unit requiring the minimum transfer cost of the exposure work information is selected from among the units registered in Step S211, and the exposure information is requested to the selected unit for file transfer.

The sequence of transfer costs should previously be stored in memories of the individual exposure units and the host computer 30 in the form of tables. The transfer cost is proportional, for example, to the data transmission distance.

According to the first embodiment of the invention, as described above, when using a plurality of semiconductor exposure units connected to a communication network, it is not necessary for all the semiconductor exposure units to have all pieces of exposure work information which may become necessary, and there is provided an advantage of easier maintenance and management of the exposure work information.

File transfer as described in the first embodiment may be accomplished by a configuration described later in the second and subsequent embodiments.

According to the configuration of the first embodiment as described above, it is determined as to whether or not exposure work information exists in any of exposure units composing a production system, even when the exposure work information necessary for the exposure work is non-existent in one particular exposure unit. As a result, an operator can determine the possibility of starting the exposure work without the need to retrieve the presence of the appropriate exposure work information. Further, by acquiring the corresponding exposure work information from the other unit, it is possible to start the exposure work if any one of the units of the production system has the exposure work information.

Other Embodiments

As a result of the recent progress of semiconductor manufacturing plants tending to form a network, semiconductor exposure units (hereinafter referred to as "steppers") are connected in an increasing number of cases by the use of various LAN (Local Area Network) connecting devices or private/public line networks in compliance with a standard network protocol such as Ethernet (TCP/IP, NetWare, Apple Talk, etc.). Under the effect of development and popularization of standard networking technology, building of a semiconductor exposure unit system for automation of a semiconductor exposure process is becoming easier by controlling steppers via a network with the use of a semiconductor exposure unit management system (hereinafter referred to as a "server") connected to the network. Such network-connection is, therefore, enabling the ability to carry out preparation and compiling of data files and distribution and updating from outside a clean room.

Conventional online systems using a low-speed line such as RS232C are also retained and managed as existing systems.

It is, therefore, demanded to build a system by the simultaneous utilization of an online system using a low-speed line and a network system using an LAN or the like having a relatively high-speed data transfer ability.

In the second to the seventh embodiments of the invention described below, therefore, upon receipt of an instruction to switch over data files to be used as an online command from a host computer connected via a low-speed interface in compliance with the semiconductor communication standard protocol, the semiconductor exposure unit requests the supply of necessary data files to a server connected so as to be capable of performing high-speed communication.

In the third embodiment of the invention, when the semiconductor exposure unit receives a switching instruction of a data file from the host computer connected by a relatively low-speed line as an online system, a necessary data file is transferred via a network based on a high-speed LAN or the like to that semiconductor exposure unit. When the data file is specified in the storage in the corresponding semiconductor exposure unit, data file transfer via a network is accomplished on demand from the server. According to this embodiment, it is possible to fully make use of a network system based on a high-speed LAN or the like while retaining the existing configuration as an online system.

In the fourth embodiment, upon receipt of a switching instruction of a data file, the semiconductor exposure unit also receives in advance an instruction to switch over a data file which must be executed in the future, and requests the aforesaid server to supply in a lump a plurality of data files necessary for switching over these future ones. Data files previously transferred are accumulated in a queue until the use thereof for an exposing operation, and are sequentially employed upon use of the data. According to this procedure, the data transfer waiting time upon switching over the data files can be reduced.

In the fifth embodiment, one semiconductor exposure unit selected from among a semiconductor exposure unit group in response to the exposure work to be executed by the individual semiconductor exposure units receives a data file switching instruction in the form of an online command from the host computer and receives a transfer of the data file. In this case, the server may previously transfer files becoming necessary in the future in compliance with an instruction from the host computer in the aforesaid other semiconductor exposure units by simultaneously transferring the transferred data file also to the other semiconductor exposure units within the foregoing semiconductor exposure unit group using the same data file as that used by the aforesaid one semiconductor exposure unit. This permits minimization of the number of file transfer request instructions from the semiconductor exposure units within the same group to the server.

In the sixth embodiment of the invention, when semiconductor exposure units include managed semiconductor exposure units and general semiconductor exposure units, and the managed semiconductor exposure unit has a server in failure or in stoppage such as in maintenance, a necessary data file may be transferred to a general semiconductor exposure unit. In this case, there is provided verifying means and managing means for discriminating between the managed semiconductor exposure units and the general semiconductors exposure units within the semiconductor exposure unit groups, and the managed semiconductor exposure units have data file transfer means in storages of the general semiconductor exposure units. When the server is in stoppage as a result of failure or maintenance, the managed semiconductor exposure units are discriminated from each other within the semiconductor exposure unit groups. The power of transferring a data file to the storage of the general semiconductor exposure units is imparted to the managed semiconductor exposure units so as to enable the managed semiconductor exposure unit to perform transfer processing of a data file to the general semiconductor exposure units in place of the server, and so as to prevent stoppage of the entire system caused by server trouble by operating the managed semiconductor exposure units as a substitution of the server even in stoppage of the server.

According to the seventh embodiment of the invention, the server registers the timing when the data file transferred to the semiconductor exposure unit will become unnecessary upon transfer at the server or the semiconductor exposure unit. When this timing is reached, it is desirable to detect it and then automatically, the data file. This permits achievement of effective management of a relating small-capacity storage of each semiconductor exposure unit, and reduction of a load on a system managing operator through automatic maintenance regarding file deletion.

As the aforesaid network, for example, an Ethernet is applicable. For the network connecting means, for example, a protocol such as TCP/IP, NetWare or Apple Talk can be employed. The second to the seventh embodiments will now be described sequentially further in detail.

Second Embodiment

Figure 7:
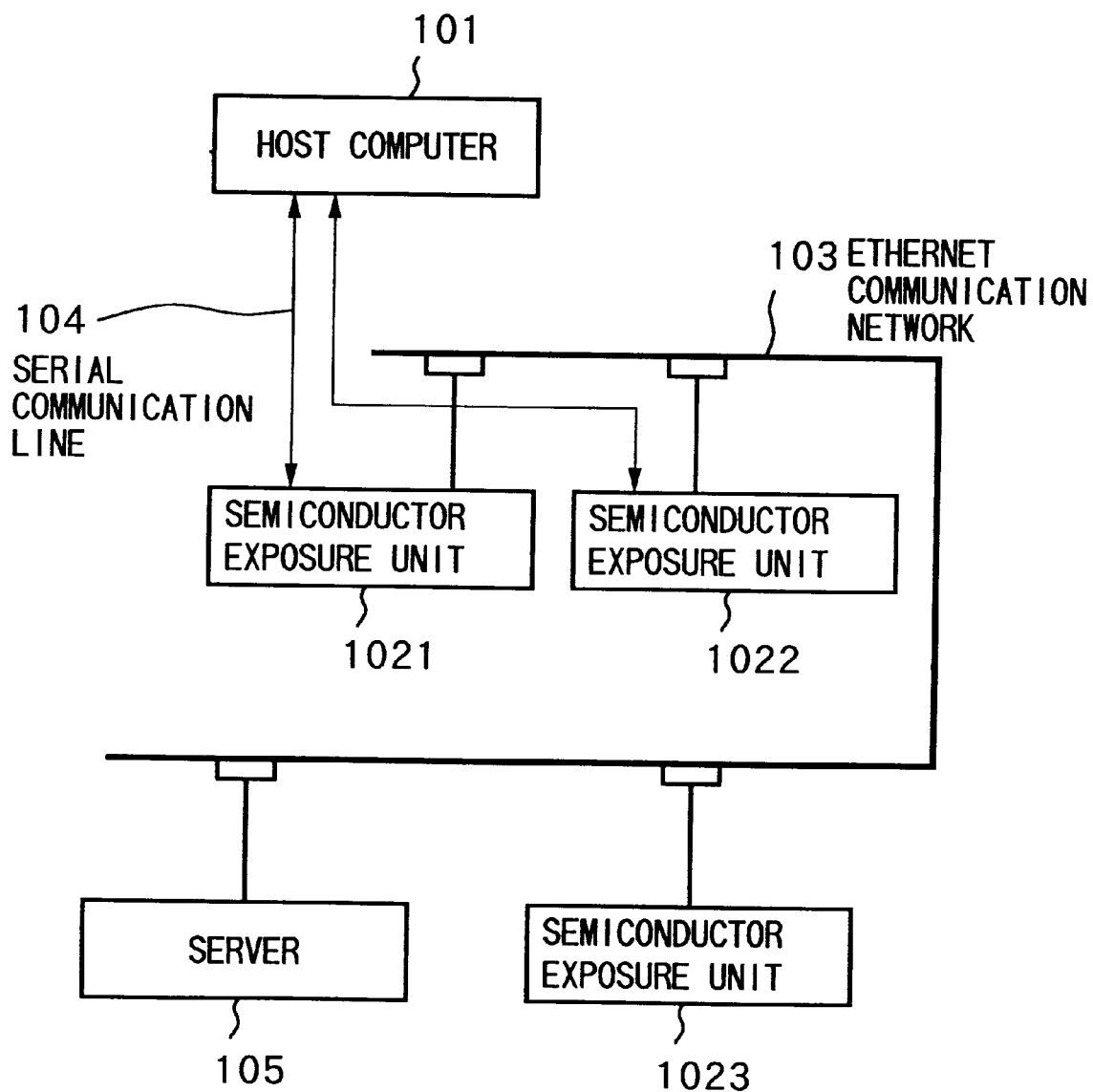
FIG. 7 illustrates the network configuration of the semiconductor exposure system of a second embodiment of the invention.

FIG. 7 illustrates a form of a network connection of the network-based semiconductor exposure unit system of the second embodiment of the invention. The network-based semiconductor exposure units (steppers) 1021, 1022 and 1023 are connected through an Ethernet communication network 103 to the server 105. The server 105 performs classification/holding management of data files such as job files, reticle files and equipment constants used in the individual steppers connected to the network, and preparation and compiling of these data files. Further, the server 105 transfers data files via the Ethernet communication network 103 to the steppers 1021 to 1023.

The steppers 1021 and 1022 are connected to the host computer 101 via a serial communication line 104 in compliance with a serial communication method using an RS-232C or the like and housed therein. The steppers 1021 and 1022 carry out data communication via the serial communication line 104 with the computer 101, receive various operational and control commands from the host computer 101 and transmit various measured data to the host computer 101. An online system permitting automatic control without the need of human intervention in a clean room is thus constructed. In this configuration, the stepper 1023, which does not participate in management in the online system, has transfer means of data files via network connection by Ethernet.

Figure 8:
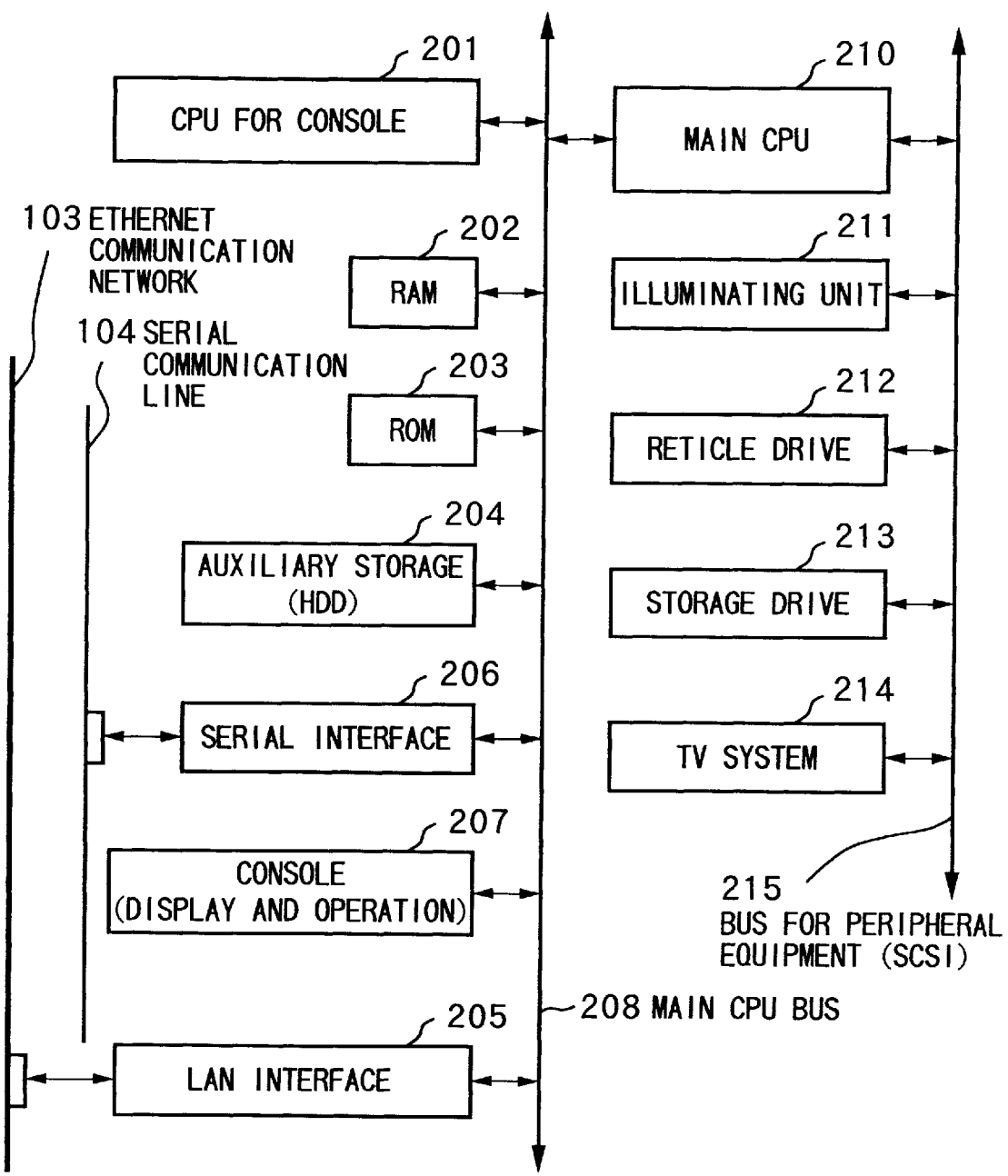
FIG. 8 is a block diagram illustrating the hardware configuration of the semiconductor exposure unit capable of coping with a network used in the system shown in FIG. 7.

FIG. 8 is a block diagram illustrating a hardware system configuration of the network-based semiconductor exposure units 1021 to 1023. In FIG. 8, 201 is a CPU for a console which controls console display for the semiconductor exposure units and operational control through console command input; 202 is an RAM for the CPU 201 to store application programs and data; 203 is an ROM for storing programs; 204 is an auxiliary storage (hard disk or the like) used for storing data and programs; and 205 is an LAN interface for carrying out communication with an Ethernet communication network 103. While a standard network protocol such as TCP/IP is often employed when conducting communication via an LAN interface 205, a protocol commonly diffused such as Apple Talk or NetWare may be used. Also, in FIG. 8, 206 is a serial communication interface connected via a serial line 104 such as an RS232C to the host computer, and permits system construction of a system capable of performing, remote operating control known generally as an online system. When conducting communication with the host computer by the use of the serial communication line 104, it is the usual practice in many cases to use a protocol in compliance with the Semiconductor Communication Standard (SECS), whereas a non-standard protocol may be independently designed and applied.

The reference numeral 207 is a console unit: the operator can issue an instruction to the CPU 201 for the console from this console unit. A CRT, a liquid crystal unit, an EL panel, or a plasma display is commonly used as a display for the console unit 207. As an input unit for the console unit 207, a keyboard for key-entering a command is used in many cases, but an input unit may be built with a pen-input unit (tablet) based on an electronic pen or a touch panel. In FIG. 8, 210 is a main CPU which fully controls various controllers forming the semiconductor exposure units. The main CPU 210 and the console CPU 201 are connected by a main CPU bus 208 and act to control the semiconductor exposure units. In FIG. 8, 211 is an illuminating unit for controlling the light source for exposing a wafer for manufacturing a semiconductor; 212 is a reticle drive for controlling transfer of a reticle (photo-mask) bearing a pattern drawn thereon for exposing a wafer for manufacturing a semiconductor; 213 is a stage drive for drive-controlling the wafer on an XY-stage for carrying out a step-up-and-repeat exposure of the wafer for manufacturing a semiconductor; and 214 is a TV system for accurate positioning of the wafer in manufacturing a semiconductor. These devices 211 to 214 are controlled by the main CPU 210 through the peripheral equipment bus 215. In this embodiment, an SCSI is used as the peripheral equipment bus 215, but the bus 215 may be formed by any general-purpose standard bus.

Figure 9:
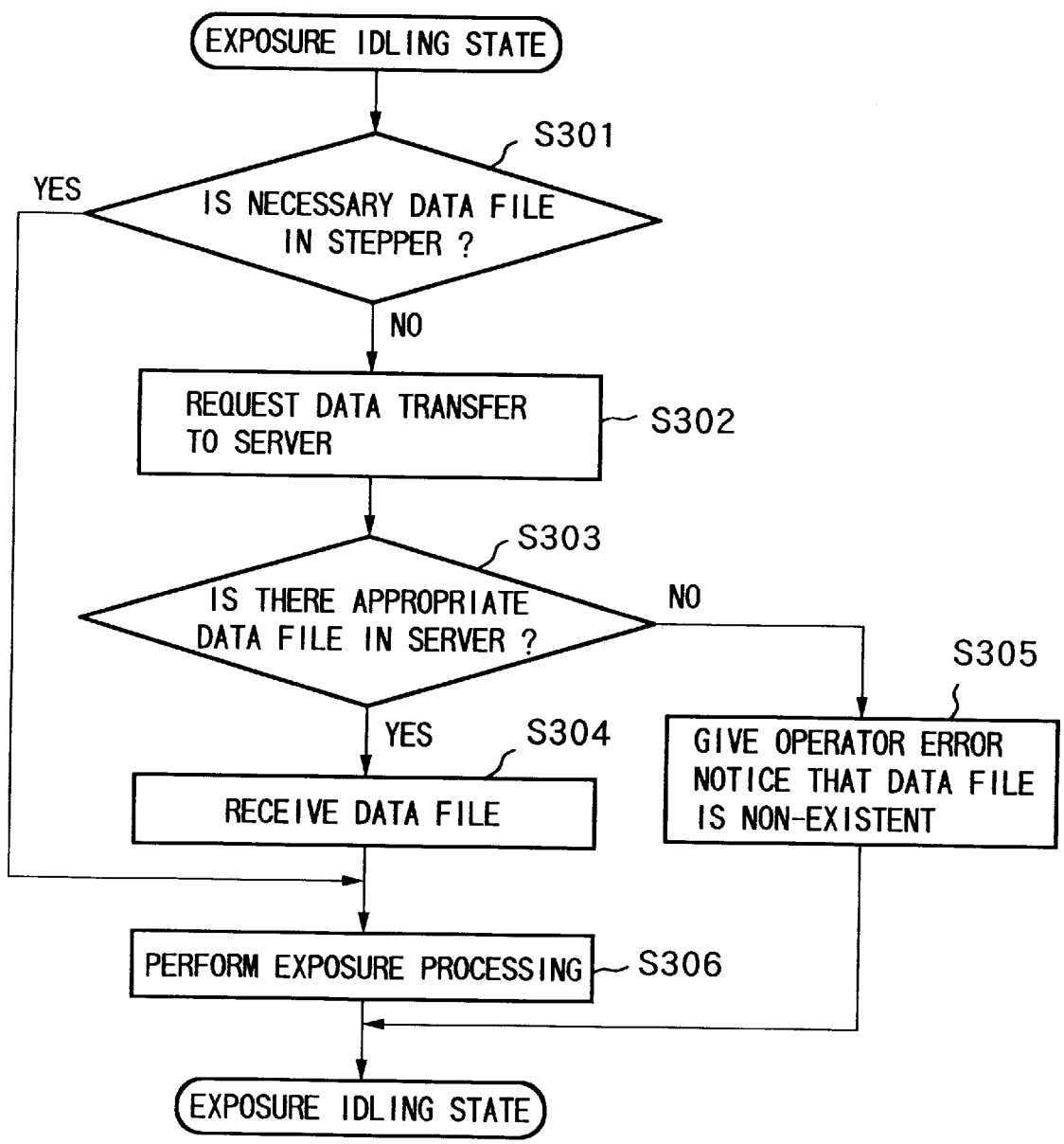
FIG. 9 is a flowchart illustrating operations of the second embodiment.

FIG. 9 is a flowchart illustrating an example of action of the semiconductor exposure unit (stepper) according to the second embodiment of the invention. When the steppers 1021 to 1023 carry out an exposure operation, a necessary data file such as a job file or a reticle file is requested to the server 105. The data file can thus be prepared on demand without the need to retain previously the data file in the steppers.

More specifically, exposure processing is started when an operator's instruction or the like is received during an exposure idling state in which the steppers wait for the next exposure processing, and the process goes to Step S301. In Step S301, the data file necessary for exposure is investigated. When the desired data file is already existent on the stepper, the exposure processing is started by the use the data file in Step S306. Upon completion of the exposure processing, the exposure idling started is resumed.

When, in Step S301, the desired data file is not present in the stepper, transfer of that data file is requested to the server 105 in Step S302. Then, in Step S303, the response from the server to the transfer request of that data file is confirmed, and when the appropriate data file is present in the server, and there is a data transfer instruction from the server, the data file is received in Step S304. After receiving the data file, the process goes to Step S306, in which exposure processing is started by the use of that data file. Upon completion of the exposure processing, the process returns to the exposure idling state.

If the desired data file in question does not exist in the server in Step S303, an operator call error is generated on the stepper to notify the operator of the non-existence of the data file, and the process returns to the exposure idling state without moving to the exposure processing.

According to the second embodiment, as described above, the data file is transferred on demand (as required) from the server to the stepper without storing the data file such as a job file or a reticle file on the stepper (semiconductor exposure unit) side. There is, therefore, provided an advantage of efficiently managing the system with the minimum capacity of the storage thereof without the need of a large-capacity storage for storing files locally on the stepper side.

Third Embodiment

FIG. 10 is a flowchart illustrating an example of operation according to the third embodiment of the network-based semiconductor exposure unit (stepper) described in the above embodiment. More specifically, the third embodiment relates to a case where, in the network-based semiconductor exposure system in the second embodiment, the network-based semiconductor exposure units are connected to the host computer via a relatively low-speed serial communication line 104 such as an RS232C in compliance with a protocol conforming to the Semiconductor Communication Standard (SECS) and are managed as an existing online system. That is, when a switching instruction of a data file such as a job file or a reticle file in the form of an online instruction is received from the host computer, the data file group is transferred from the server connected to the relatively high-speed network.

More particularly, when the stepper starts process from the exposure idling state in which the next exposure processing is waited for, first in Step S401, an online instruction to switch over the data file is received via the serial communication line from the host computer. Then in Step S402, the data file specified in the online instruction is checked up. When the desired data file is present already on the stepper, the process proceeds to Step S407 to start the exposure processing by the use of that data file. Upon completion of the exposure processing, the result of exposure processing is notified to the host computer in Step S408 and the process returns to the exposure idling state.

If that data file is not present in the stepper in Step S402, transfer of the appropriate data file is requested to the server 105 in Step S403. In Step S404, the response from the server to the data file transfer request is confirmed. When the appropriate data file exists in the server and a data transfer instruction is received from the server, the data file is received in Step S405. After receiving the data file, the exposure processing is started in Step S407 by the use of the data file. Upon completion of the exposure processing, the result of the exposure processing is notified to the host computer in Step S408 to return to the exposure idling state.

When the appropriate data file is not present in the server in Step S404, an error report showing non-existence of the data file is sent to the host computer in Step S406, and the process returns to the exposure idling state without going to the exposure processing.

According to the third embodiment of the invention, as described above, when the online system built through a relatively low-speed in compliance with a protocol conforming to the Semiconductor Communication Standard is maintained while keeping the existing configuration, and an instruction to switch over the data file such as a job file or a reticle file in response to the online instruction is received from the host computer, an advantage is provided in that it is possible to automatically transfer the data file used in the online system from the server and automatically update the same by transferring that data file group from the server high-speed network-connected.

Fourth Embodiment

The fourth embodiment of the invention relates to a case where the data file switching instruction from the host computer is a switching instruction of a plurality of data files. That is, this is a method of receiving a switching instruction of a plurality of data files from the host computer, and transferring data files necessary for exposure processing contained in a plurality of parameter switching instructions in a lump from the server. The object of this embodiment is achieved by, prior to conducting the exposure processing, performing receiving of the data file switching instruction of the third embodiment and transfer of the data files from the server in a lump for the plurality of data files in advance.

Figure 11:
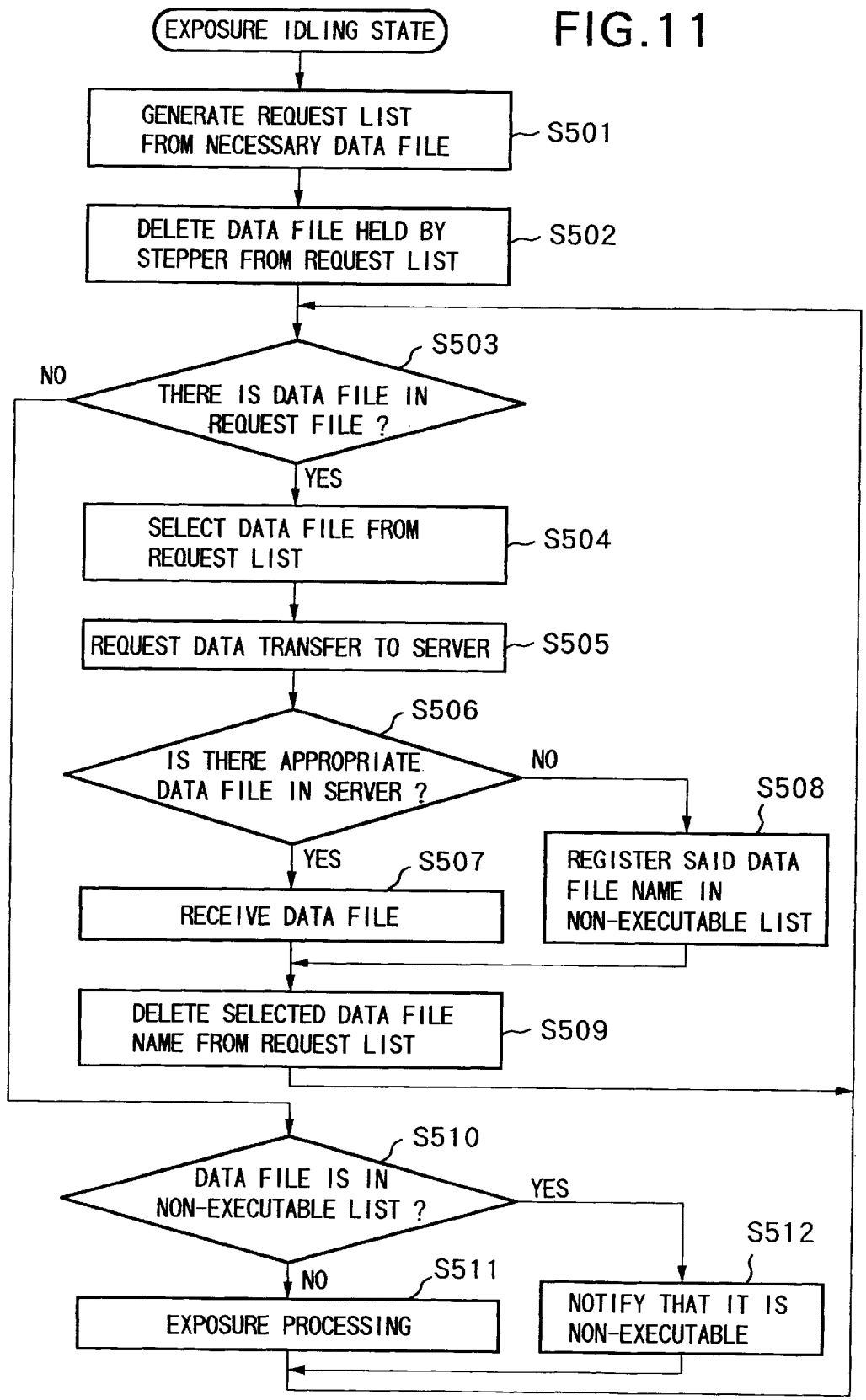
FIG. 11 is a flowchart illustrating operations of the fourth embodiment.

FIG. 11 is a flowchart illustrating an example of operation of the semiconductor exposure unit in the fourth embodiment. In this embodiment, upon receipt of a plurality of data file switching instructions, a request list recording names of necessary data files from the received instruction is generated in Step S501. Then in Step S502, when the data file existing in the semiconductor exposure unit is present in the aforesaid request list, the corresponding data file name is deleted from the request list. That is to prevent the data file already existing in the semiconductor exposure unit from being loaded again from the server in a subsequent processing.

In Step S503, it is determined whether or not the data file to be acquired is present in the request list. When the data file to be acquired is present, the process goes to Step S504. In Step S504, one data file name is selected from the request list, and in Step S505, transfer of the appropriate data file is requested to the server. If the appropriate data file is present in the server, that data file is received from the server (Steps S506 and S507). When the corresponding data file is not present, the name of that data file is registered in the unexecutable list (Steps S506 and S508). In Step S509, the name of the just processed data file is deleted from the request list to return to Step S503.

Upon completion of processing for all the data files registered in the request list as described above, the process passes from Step S503 to Step S510. In Step S510, it is determined whether or not the data file name is registered in the unexecutable list, and when it is not registered, the exposure processing in compliance with that switching instruction is started. When the data file name is registered in the unexecutable list, on the other hand, that switching instruction is unexecutable, and a notice to that effect is given to the operator. This notice can be given by sending a message to that effect to the host computer, or displaying the fact on a display screen of that exposure unit. The names of executable data files may be simultaneously notified.

According to the fourth embodiment of the invention, as described above, there is available an advantage of reducing the data transfer waiting time at the time when that data file is required by receiving, upon receipt of a data file switching instruction online from the host computer, instructions to switch over a plurality of data files in advance and previously transferring the data files shown in the plurality of parameter switching instructions in a lump from the server.

Fifth Embodiment

The fifth embodiment of the invention relates to a case where a stepper receives a data file from the server in the same manner as in the foregoing third embodiment from among stepper groups formed by grouping according to similarity of contents of the exposure work, and the data file is previously transferred even when a data file transfer request is not generated from the other stepper to the server.

Figure 12:
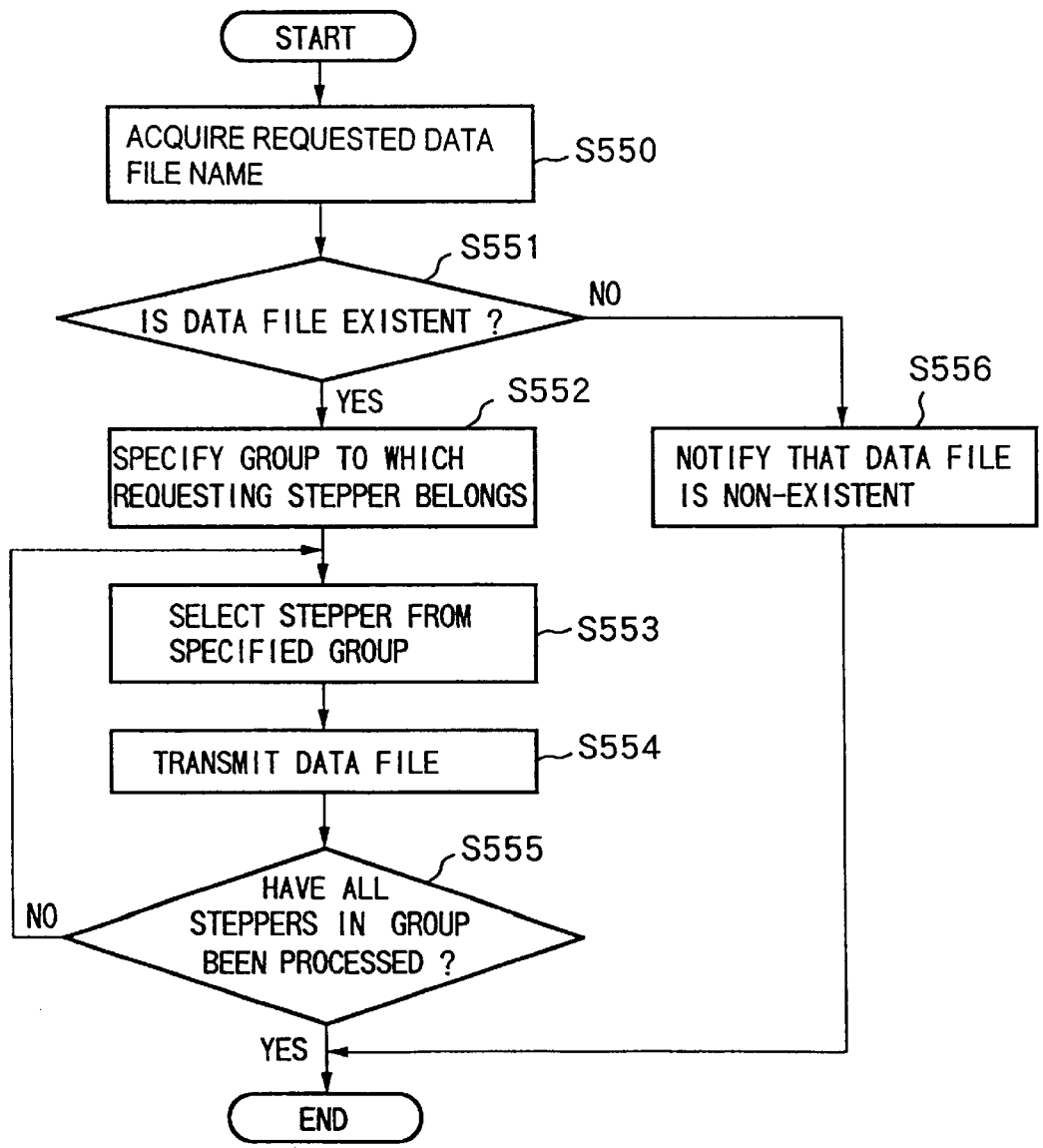
FIG. 12A illustrates a configuration of group-registered data in a semiconductor exposure unit in the system.
FIG. 12B is a flowchart illustrating the processing procedure upon receipt of a data file transfer request in a server in the fifth embodiment.

FIG. 12A illustrates an example of a configuration of group-registered data of the semiconductor exposure unit within the system. The registered data is retained in the server 105.

FIG. 12B is a flowchart illustrating the processing procedure of the server in the fifth embodiment upon receipt of a data file transfer request. First, in Step S550, the name of the data file requested by the data file transfer request is acquired. Then, in Step S551, it is determined whether or not the requested data file is present in the server 105. When the corresponding data file is determined to be non-existent, the process passes to Step S556, and this is notified.

When the requested data file is present, the data file is transferred to the individual semiconductor exposure units within a group to which the semiconductor exposure unit which issued the data file transfer request belongs, through processing of Steps S552 to S555.

First, in Step S552, the group to which the semiconductor exposure unit which issued the data file transfer request belongs is specified with reference to the group-registered data shown in FIG. 12A. Then, one of the specified group-registered semiconductor exposure units is selected (Step S553), and the requested data file is transmitted to the selected semiconductor exposure unit (Step S554). The processing of these Steps S553 and S554 is applied to all the semiconductor exposure units registered in the group specified in Step S552 (Step S554).

According to the fifth embodiment of the invention, as described above, in a case where one stepper from among stepper groups divided in terms of the kind of exposure work to be carried out by the individual steppers receives a data file switching instruction in the form of an online instruction from the host computer and the data file is transferred from the server, there is available an advantage of permitting a previous transfer of files necessary in response to an online instruction to the other steppers within the group by simultaneously transferring files in a lump also to the other steppers in the group using the same data files.

Sixth Embodiment

Figure 13:
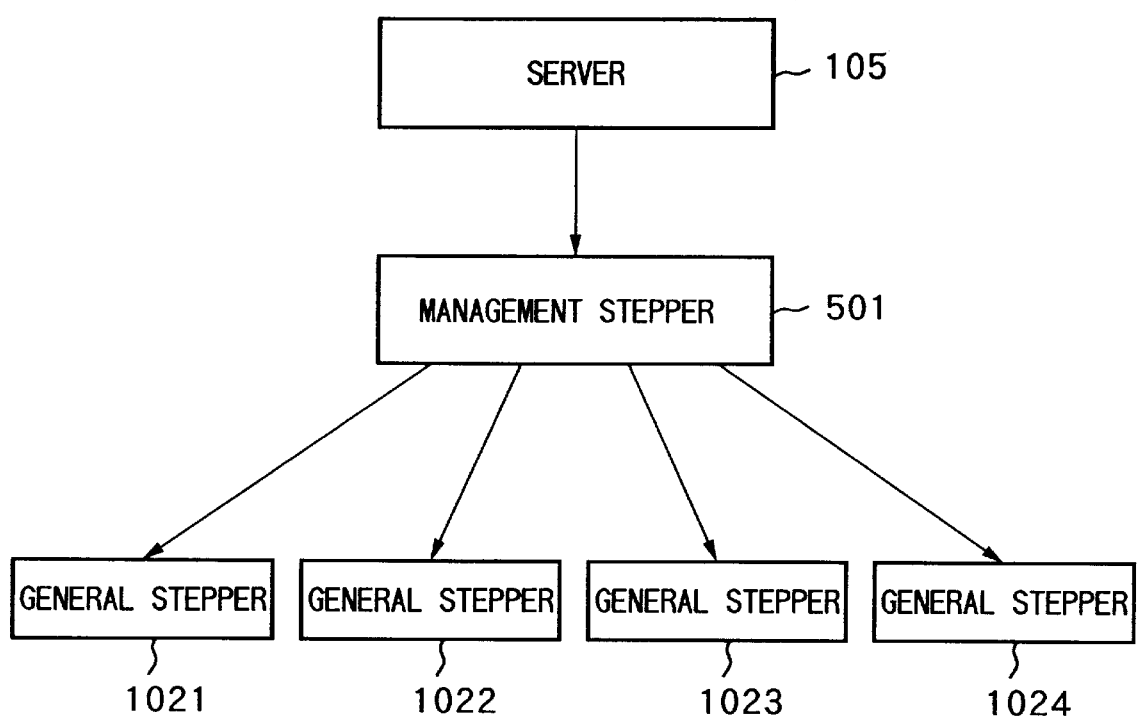
FIG. 13 illustrates a management hierarchy of a semiconductor exposure system of the sixth embodiment of the invention.

The sixth embodiment of the invention has an object to avoid the state in which data transfer becomes impossible during stoppage of the server because of a failure or maintenance in the first embodiment of the invention. FIG. 13 illustrates a hierarchical structure of management facility of the server, the managed stepper and the general stepper in the sixth embodiment. When the server 105 is in stoppage, for example, during maintenance, a managed stepper 501 not shown in FIG. 7 has a facility to write data files into storages of general steppers 1021 to 1024 in place of the server. The general steppers allows writing of data files from the server and the managed steppers. The managed stepper permits writing of data files from the server. That is, the hierarchical structure of the write power presents a sequence with the server 105 at the uppermost position and then the managed steppers 501 and the general steppers 1021 to 1024, as shown in FIG. 13. When the server is in maintenance, for example, the stepper operator can transfer the data file necessary for the general steppers from the managed steppers without the use of the server. In this case, the managed stepper 501 has the same file transfer function as that of the server and shares data files with the server 105.

According to the sixth embodiment of the invention, as described above, when the server is in stoppage as a result of a failure or maintenance, there are advantages of permitting avoidance of stoppage of the entire system, transferring of a necessary data file from the managed stepper even during stoppage of the server, and continuing exposure processing of a semiconductor device without the need to provide an expensive server for backup, by causing the managed stepper to take the role of a data file transfer to general steppers.

Seventh Embodiment

Figures 14, 15:
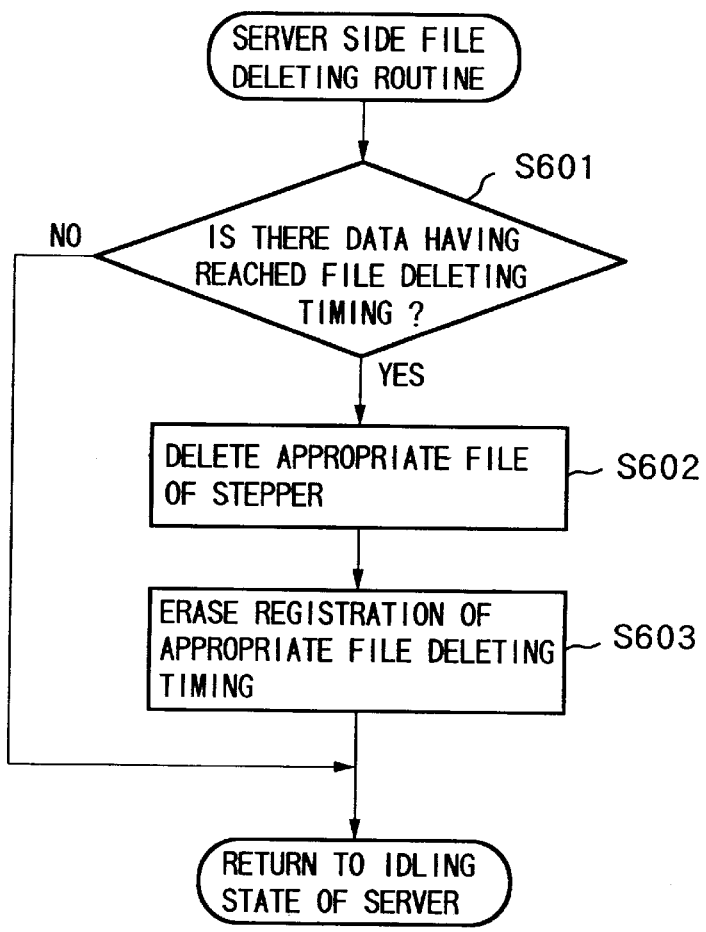
FIG. 14 is a flowchart illustrating operations of the seventh embodiment of the invention.
FIG. 15 illustrates an example of a registration list of the data file deletion timing used in the server embodiment of the invention.

FIG. 14 is a flowchart illustrating operations of the network-based semiconductor exposure unit (stepper) of the seventh embodiment of the invention. More particularly, the timing when a data file transferred to the stepper becomes unnecessary is previously registered in the server or the stepper and deleting the data file automatically from the storage of the stepper, thereby efficiently managing the small-capacity storage of that stepper.

Upon transferring the data file from the server to the stepper in a data transfer step, as described in the foregoing embodiment, the expiration date of the transferred data file is registered for each file or for each file group. The data file expiration dates are registered in the form of a list as shown in FIG. 15, and are retained on the server side or on the stepper side. In this embodiment, the expiration date registration list is retained on the server side. The stepper name 701, the data file name 702, and the expiration date 703 are registered in the list shown in FIG. 15. By making a specification using a wild card "a*.job", it is possible to register a plurality of file deletions in a lump. Various objects of deletion can be specified by using normal expressions.

Now, the procedure leading to file deletion will be described with reference to the flowchart of FIG. 14. In the file deleting routine of the server, first in Step S601, the server monitors the time of the day: when the time of the day of any registered data in the expiration date registration list retained by the server has expired, the process proceeds to Step S602. In Step S602, the data file of the corresponding stepper is deleted. That is, a protocol for instructing file deletion is previously defined between the server and the stepper. Upon receipt of an instruction to delete that data file, the data file is deleted by a file deleting command or the like on the stepper side. Then, in Step S603, upon receipt of a report of completion of file deletion on the stepper side, the server deletes the corresponding registration from the expiration date registration list of the server. In Step S602, when it is failed to delete a file because that file has already been deleted manually on the stepper side, an error log is left on the server side. Each exposure unit can have the file deleting function as described above.

According to the seventh embodiment, as described above, the timing when a data file transferred to the stepper becomes unnecessary is previously registered in the server or the stepper, and file deletion is accomplished automatically from the storage of the stepper. As a result, it is possible to automatically delete a data file having been utilized in exposure processing over a long period of time such as three or six months, achieve an efficient management of a small-capacity storage of the stepper, and permit omission of the complicated disposal of file groups transferred to the stepper so far carried out manually by the operator.

Embodiment of Device Manufacturing Method

Now, an embodiment of a method for manufacturing a device utilizing the semiconductor exposure system described above will be described.

Figure 16:
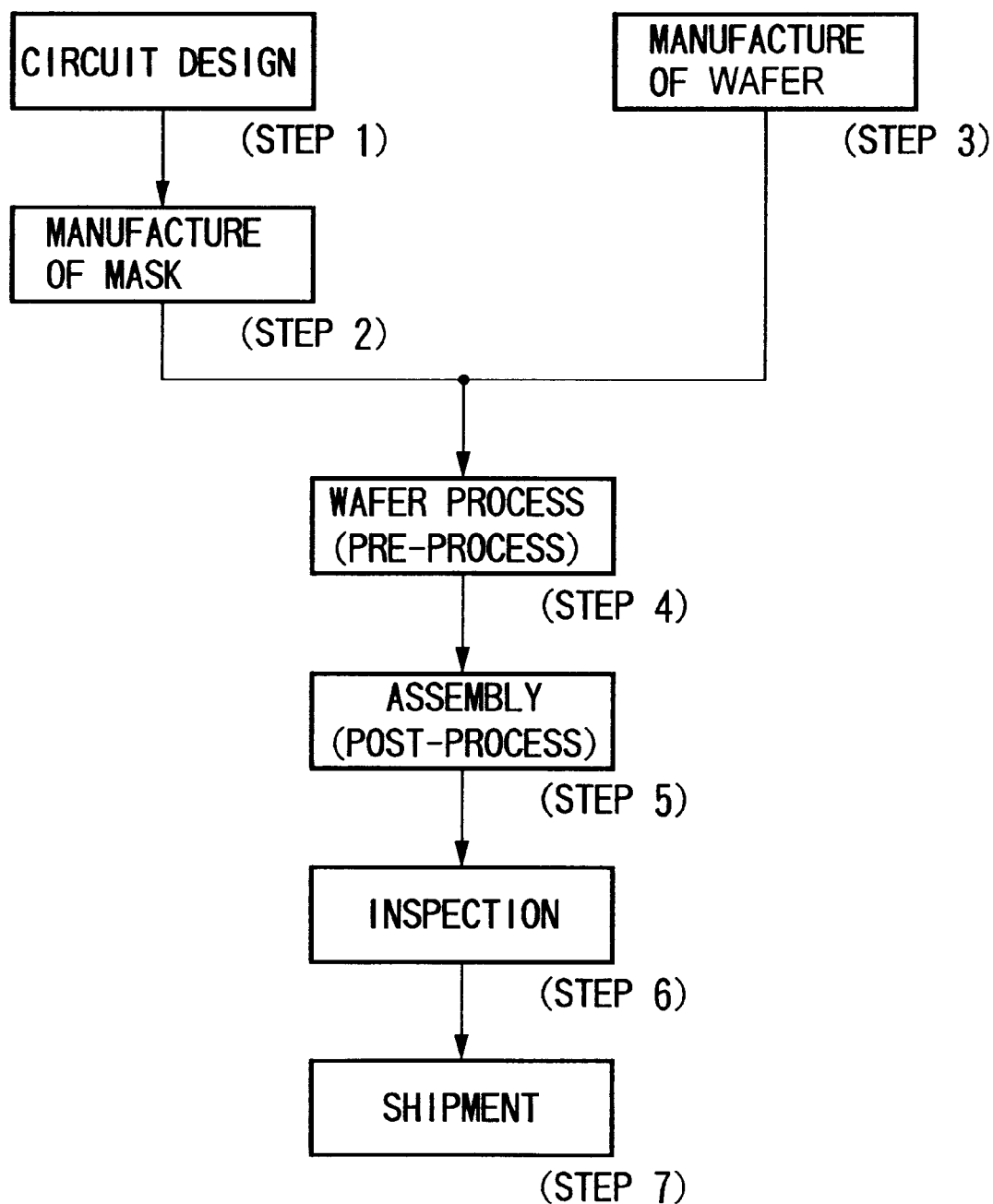
FIG. 16 is a flowchart illustrating a device manufacturing process using the semiconductor exposure system in an embodiment of the invention.

FIG. 16 is a manufacturing flow of a micro-device (e.g., a semiconductor chip such as IC or LSI, a liquid crystal panel, a CCD, a thin-film magnetic head or micro machine). In Step 1 (circuit design), a pattern design of a device is conducted. In Step 2 (manufacture of mask), a mask having a pattern formed thereon is manufactured. In Step 3 (manufacture of a wafer), on the other hand, a wafer is manufactured from a material such as silicon or glass. In Step 4 (wafer process), which is called the pre-process, an actual circuit is formed on a wafer by the use of the mask and the wafer prepared as above by lithographic technology. In the next Step 5 (assembly), which is called the post process, a semiconductor chip is manufactured from a wafer prepared in Step 4, through such steps as an assembly step (dicing, bonding) and a packaging step (chip sealing). In Step 6 (inspection), inspections such as an operational confirmation test and a durability test of the semiconductor device manufactured in Step 5 are carried out. A semiconductor device is completed through these steps and shipped (Step 7).

Figure 17:
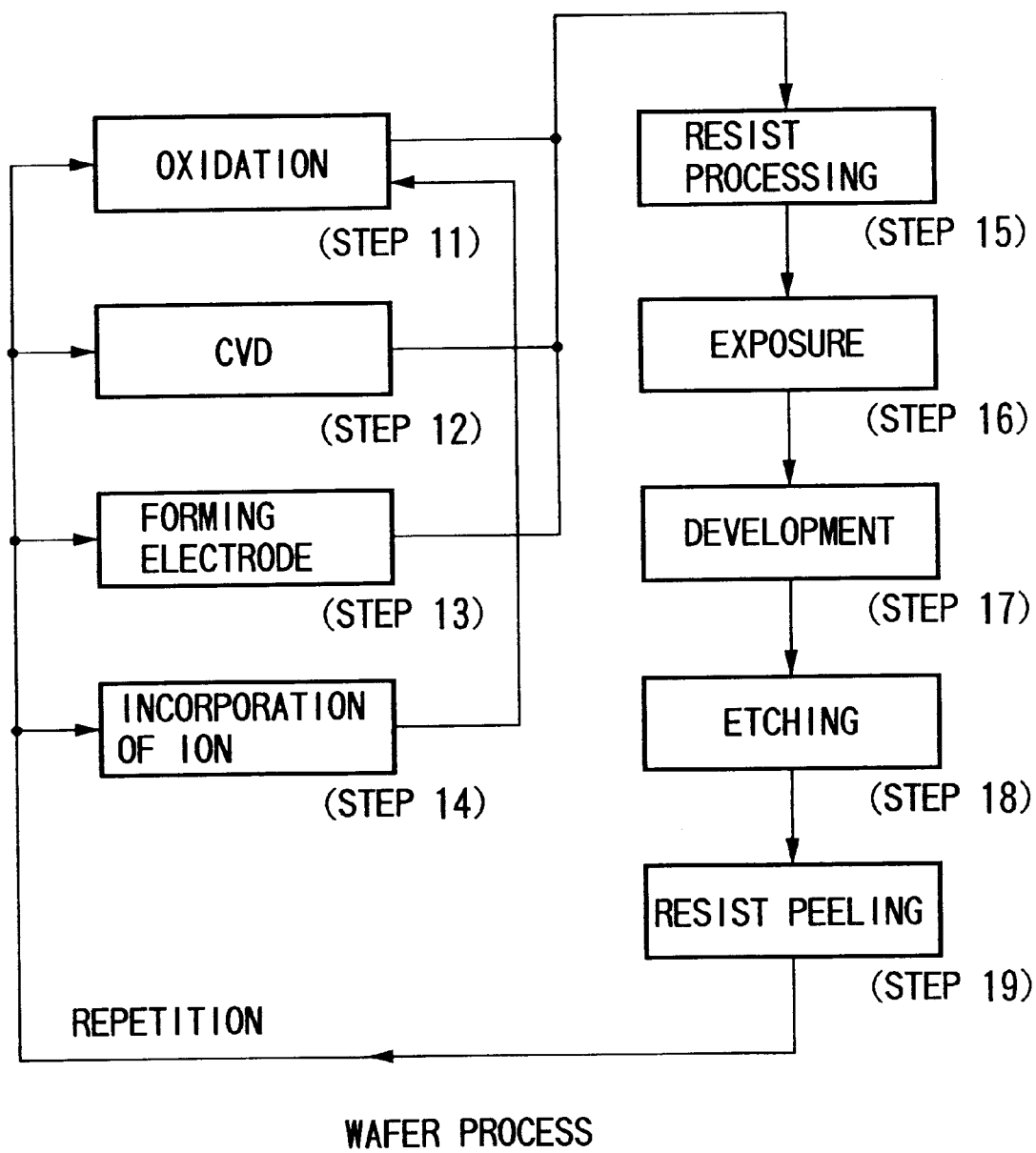
FIG. 17 is a flowchart illustrating a detailed flow of the wafer process shown in FIG. 16.

FIG. 17 illustrates a detailed flow of the aforementioned wafer process. In Step 11 (oxidation), the surface of the wafer is oxidized. In Step 12 (CVD), an insulating film is formed on the wafer surface. In Step 13 (electrode forming), an electrode is formed by vapor deposition on the wafer. In Step 14 (ion implantation), ions are implanted. In Step 15 (resist processing), a resist is coated onto the wafer. In Step 16 (exposure), the circuit patterns of the mask are arranged on a plurality of shot areas and print-exposed in the exposure unit or the exposing method described above. In Step 17 (development), the exposed wafer is developed. In Step 18 (etching), portions other than the developed resist image are scraped off. In Step 19 (resist pealing), any resist remaining after etching is removed. Multiple circuit patterns are formed on the wafer by repeating these steps.

By using the method of this embodiment, a large-sized device of which the manufacture has conventionally been difficult can be manufactured at a low cost.

As many apparently widely different embodiments of the present invention can be made without departing from the spirit and scope thereof, it is to be understood that the invention is not limited to the specific embodiments thereof except as defined in the claims.

What is claimed is:

1. An exposure unit for performing exposure processing in which a pattern on a mask is print-exposed onto a substrate on the basis of exposure work information, said exposure unit comprising:

communication means for performing communication with external units;

determining means for determining whether or not said exposure unit has specified work information;

inquiring means for inquiring of an external unit via said communication means about a presence or an absence of work information when said determining means determines a non-existence of said specified work information; and deciding means for deciding whether or not the exposure processing based on said specified work information is executable on the basis of the result of the inquiry by said inquiring means.

2. An exposure unit according to claim 1, wherein said exposure unit further comprises notifying means for notifying the external unit via said communication means of the result of a decision by said deciding means.

3. An exposure unit for performing exposure processing in which a pattern on a mask is print-exposed onto a substrate on the basis of exposure work information, said exposure unit comprising:

communication means for performing communication with external units;

determining means for determining whether or not said exposure unit has specified work information;

inquiring means for inquiring of an external unit via said communication means about a presence or an absence of work information when said determining means determines a non-existence of said specified work information; and receiving means for receiving said specified work information via said communication means from an external unit having given a response notifying of the presence of said specified work information.

4. An exposure unit according to claim 3, wherein:
the external units to receive inquiries from said inquiring means are in a sequence from low to high costs required for obtaining work information; and
wherein said receiving means receives, upon receipt of an inquiry from said inquiring means, said specified work information via said communication means from the external unit having first returned a positive response.

5. An exposure unit according to claim 3, wherein said receiving means receives, upon receipt of a positive response to an inquiry by said inquiring means, information transmitted in succession to said response as said specified work information.

6. An exposure unit according to claim 3, wherein said inquiring means inquires of all external units allowing inquiry by the use of said communication means about the presence or absence of said specified work information;
and wherein said receiving means selects one of the external units having given a positive response to an inquiry from said inquiring means, and receives said specified work information from said external unit selected via said communication means.

7. An exposure unit according to claim 6, wherein said receiving means selects one requiring the minimum cost for obtaining the work information from among the external units having given a positive response to an inquiry by said inquiring means.

8. An exposure unit according to claim 3, wherein said exposure unit further comprises:
message receiving means for receiving a message inquiring about the presence or absence of work information from external units via said communication means; and
message sending means which determines whether or not said exposure unit has work information indicated by an inquiry message received by said message receiving means, and sends the result of the determination via said communication means to said external unit.

9. An exposure unit according to claim 8, wherein said message sending means, when determining that the work information indicated by said inquiring message is present in said exposure unit, transmits said work information, together with information showing the result of the determination, to said external unit.

10. An exposure unit for performing a specified exposure processing, said exposure unit comprising:
communication means capable of being connected to a network having a server unit;
determining means for determining whether or not work information necessary for executing the specified exposure processing is present in said unit;
requesting means which, when said determining means determines that the necessary work information is not existent in said unit, requests said work information via said network to said server unit;
receiving means for receiving the work information transmitted via said communication means from said server unit in response to said request by said requesting means; and
exposing means for executing said specified exposure processing in which a pattern on a mask is print-exposed onto a substrate on the basis of the work information received by said receiving means.

11. An exposure unit according to claim 10, wherein:
said communication means is communicably connected to a host equipment through a communication line other than said network; and
further comprising instruction receiving means for receiving an instruction of exposure processing to be executed via said communication line from said host equipment.

12. An exposure unit according to claim 11, wherein said communication line in said communication means has a communication rate lower than in said network.

13. An exposure unit according to claim 11, wherein said instruction receiving means receives a plurality of instructions for exposure processing via said communication line from said host equipment; and
wherein, for each of said plurality of exposure processing runs, the exposure unit further comprises control means for repeating said determining means, said requesting means, and said receiving means.

14. An exposure unit according to claim 11, wherein when said work information necessary for said specified exposure processing is not existent in said server, the exposure unit further comprises communication means for notifying said host equipment of such an effect.

15. An exposure system provided with a plurality of exposure units for conducting exposure processing in which a pattern on a mask is print-exposed onto a substrate on the basis of exposure work information, said system comprising:
communication means communicably connecting said plurality of exposure units and a host equipment and giving an exposure work instruction to the host equipment;
determining means for determining, when said host equipment specifies an exposure unit and work information, whether or not the specified exposure unit has said work information;
searching means for searching, when said determining means determines a non-existence of the specified work information, for a unit having said work information from among said plurality of exposure units and said host equipment; and
deciding means for deciding whether or not the exposure processing based on said specified work information is executable by said system, on the basis of the result of the search by said searching means.

16. An exposure system according to claim 15, wherein said system further comprises notifying means for notifying said host equipment via said communication means of the result of the determination by said determining means.

17. An exposure system provided with a plurality of exposure units for performing exposure processing in which a pattern on a mask is print-exposed onto a substrate on the basis of exposure work information, said system comprising:
communication means which communicably connects said plurality of exposure units to said host equipment giving an exposure work instruction thereto;
determining means for determining, when an exposure unit and work information are specified by said host equipment, whether or not the specified exposure unit has said work information;
searching means for searching, when said determining means determines that said specified work information is non-existent, for a unit having said work information from among said plurality of exposure units and said host equipment; and transmitting means for transmitting said specified work information from the unit searched for by said searching means via said communication means to said specified exposure unit.

18. An exposure system according to claim 17, wherein units to be searched for by said searching means are in a sequence from low to high cost required for obtaining the work information; and wherein said transmitting means transmits said specified work information from a unit found first by said searching means via said communication means to said specified exposure unit.

19. An exposure system according to claim 17, wherein said searching means performs searching for all units capable of being searched for in said communication means, and extracts a unit having said specified work information; and wherein said transmitting means selects one of the units selected by said searching means and transmits said specified work information from the external unit selected via said communication means to said specified exposure unit.

20. An exposure system according to claim 19, wherein said transmitting means selects one with a minimum cost required for obtaining the work information from among the external units having returned a positive response in said inquiring means.

21. An exposure system according to claim 17, wherein said searching means comprises:

message receiving means for receiving a message inquiring about the presence or absence of the work information from the other units via said communication means in each of the units connected to said communication means; and message transmitting means for determining whether or not said exposure unit has the work information indicated by the inquiring message received by said message receiving means, and transmitting the result of the determination to the transmitter of said message via said communication means.

22. An exposure system according to claim 21, wherein said message transmitting means transmits, when determining that the work information indicated by said inquiring message is in said exposure unit, said work information, together with the result of the determination, to said external unit.

23. An exposure system having a plurality of exposure units and at least one server, said system comprising:

communication means including a network communicably connecting said plurality of exposure units and said server;

determining means for determining whether or not the work information necessary for executing the exposure processing specified for one of said plurality of exposure units is present in said specified exposure unit;

acquiring means for acquiring, when said determining means determines that the necessary work information is non-existent in said exposure unit, said work information via said server via said communication means; and exposing means for executing said specified exposure processing in which a pattern on a mask is print-exposed onto a substrate on the basis of the work information acquired by said acquiring means.

24. An exposure system according to claim 23, wherein said communication means communicably connects said plurality of exposure units and a host equipment by the use of a communication line other than said network; and wherein each of said plurality of exposure units is further provided with instruction receiving means receiving an instruction of exposure processing via said communication line from said host equipment.

25. An exposure system according to claims 24, wherein said communication line in said communication means has a communication rate lower than that of said network.

26. An exposure system according to claim 24, wherein, when specifying information specifying a plurality of exposure processing runs in a lump is received from said host equipment in said instruction receiving means, said system further comprises control means for executing said determining means and said acquiring means repeatedly for each of the exposure processing runs specified by said specifying information.

27. An exposure system according to claim 23, wherein said server comprises:

managing means for managing the plurality of grouped exposure units; and transmitting means for transmitting said requested work information to all the exposure units in the group to which said requesting exposure unit belongs.

28. An exposure system according to claim 23, wherein at least one of said plurality of exposure units can take the place of said server for processing.

29. An exposure system according to claim 23, wherein said system further comprises:

holding means for holding a deleting timing for each of the pieces of work information transmitted to the exposure unit; and deleting means for deleting, when the deleting timing held by said holding means is reached, the corresponding work information from the storage area of the exposure unit.

30. An exposure system according to claim 29, wherein:

said holding means holds the identification information of the requested work information and the deleting timing thereof in a deletion list in correspondence to said requesting exposure unit; and wherein said deleting means comprises:

deletion requesting means for requesting, from said server, deletion of the corresponding work information to an appropriate exposure unit when the deleting timing in said deletion list is reached; and information deleting means for deleting the corresponding work information from a particular storage area thereof in response to a deleting request by said deletion requesting means in each of said exposure units.

31. A control method of an exposure unit having communication means for conducting communication with an external unit and performing exposure processing in which a pattern on a mask is print-exposed onto a substrate on the basis of the exposure work information, said method comprising:

a determining step of determining whether or not said exposure unit has the specified work information;

an inquiring step of inquiring of an external unit via said communication means about a presence or an absence of said work information when it is determined in said determining step that the specified work information is non-existent; and a deciding step of deciding whether or not an exposure processing based on said specified work information is executable, on the basis of the result of an inquiry in said inquiring step.

32. A control method of an exposure unit having communication means for conducting communication with an external unit and performing exposure processing in which a pattern on a mask is print-exposed onto a substrate on the basis of the exposure work information, said method comprising:

a determining step of determining whether or not said exposure unit has specified work information;

an inquiring step of inquiring of an external unit via said communication means about a presence or an absence of said work information when it is determined in said determining step that the specified work information is non-existent; and a receiving step of receiving, upon receipt of an inquiry in said inquiring step, said specified work information via said communication means from an external unit having given a response showing a presence of said specified work information.

33. A control method of an exposure unit having communication means capable of being connected to a network having a server and performing a specified exposure processing, said method comprising:

a determining step for determining whether or not work information necessary for executing said specified exposure processing is present in said unit;

a requesting step of requesting, when it is determined in said determining step that the necessary work information is non-existent in said unit, said work information via said network to said server;

a receiving step of receiving the work information transmitted via said communication means from said server in response to the request in said requesting step; and an exposing step of executing said specified exposure processing in which a pattern on a mask is print-exposed onto a substrate on the basis of the work information received in said receiving step.

34. A control method of an exposure system which is provided with a plurality of exposure units for performing exposure processing in which a pattern on a mask is print-exposed onto a substrate on the basis of exposure work information, a host equipment giving exposure work information to said plurality of exposure units, and communication means communicably connecting them, said method comprising:

a determining step of determining, when said host equipment specifies an exposure unit and work information, whether or not the specified exposure unit has said work information;

a searching step of searching, when non-existence of the specified work information is determined in said determining step, for a unit having said work information from among said plurality of exposure units and said host equipment; and a deciding step of deciding whether or not the exposure processing based on said specified work information is executable in said system on the basis of the result of the search in said searching step.

35. A control method of an exposure system which is provided with a plurality of exposure units for performing exposure processing in which a pattern on a mask is print-exposed onto a substrate on the basis of exposure work information, a host equipment giving exposure work to said plurality of exposure units, and communication means communicably connecting them, said method comprising:

a determining step of determining, when said host equipment specifies an exposure unit and work information, whether or not the specified exposure unit has said work information;

a searching step of searching, when non-existence of the specified work information is determined in said determining step, for a unit having said work information from among said plurality of exposure units and said host equipment; and a transmitting step of transmitting said specified work information from a unit found in said searching step via said communication means to said specified exposure unit.

36. A control method of an exposure system having a plurality of exposure units, at least one server, and communication means including a network communicably connecting them, said method comprising:

a determining step of determining whether or not work information necessary for executing the exposure processing specified for one of said plurality of exposure units is present in said specified exposure unit;

an acquiring step of acquiring, when non-existence of the necessary work information in said exposure unit is determined in said determining step, said work information via said communication means from said server; and an exposing step of executing said specified exposure processing in which a pattern on a mask is print-exposed onto a substrate on the basis of the work information acquired in said acquiring step.

* * * * *

UNITED STATES PATENT AND TRADEMARK OFFICE
CERTIFICATE OF CORRECTION

PATENT NO. : 6,185,474 B1
DATED : February 6, 2001
INVENTOR(S) : Takashi Nakamura et al.

It is certified that error appears in the above-identified patent and that said Letters Patent is hereby corrected as shown below:

Title page,
Under Item [30] Foreign Application Priority Data:
"Apr. 3, 1997 (JP) ……………………. 9-063984
July 11, 1997 (JP) ……………………. 9-320625" should read
-- Mar. 4, 1997 (JP) …………………… 9-063984
Nov. 7, 1997 (JP) …………………….9-320625 --.

Column 1,
Line 57, "demerits" should read -- disadvantages --.

Column 3,
Line 8, "start" should read -- starts --.
Line 49, "and" should read -- of --.

Column 4,
Line 25, "DRAWING" should read -- DRAWINGS --.

Column 6,
Line 16, "as" should be deleted.

Column 12,
Line 49, "low-speed" should read -- low speed --.

Column 16,
Line 20, "(pealing)," should read -- (peeling), --.

Signed and Sealed this

Eleventh Day of December, 2001

Attest:

NICHOLAS P. GODICI
*Attesting Officer*   *Acting Director of the United States Patent and Trademark Office*